(12) United States Patent
Higuma et al.

(10) Patent No.: US 8,476,895 B2
(45) Date of Patent: Jul. 2, 2013

(54) POWER MEASURING SYSTEM, MEASURING APPARATUS, LOAD TERMINAL, AND DEVICE CONTROL SYSTEM

(75) Inventors: Toshiyasu Higuma, Chiyoda-ku (JP); Noriyuki Kushiro, Chiyoda-ku (JP); Masaaki Yabe, Chiyoda-ku (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 374 days.

(21) Appl. No.: 12/745,631

(22) PCT Filed: Feb. 4, 2009

(86) PCT No.: PCT/JP2009/051841
§ 371 (c)(1),
(2), (4) Date: Jun. 1, 2010

(87) PCT Pub. No.: WO2009/099082
PCT Pub. Date: Aug. 13, 2009

(65) Prior Publication Data
US 2010/0301837 A1    Dec. 2, 2010

(30) Foreign Application Priority Data

Feb. 6, 2008  (JP) .................................. 2008-026432
Aug. 6, 2008  (JP) .................................. 2008-202562

(51) Int. Cl.
*G01R 11/32*    (2006.01)
(52) U.S. Cl.
USPC ....................................... 324/142; 324/140 R
(58) Field of Classification Search
USPC ........ 324/140 R, 142, 114, 74; 318/105–113; 702/60, 62
See application file for complete search history.

(56) References Cited

U.S. PATENT DOCUMENTS 6,470,283 B1 * 10/2002 Edel .................................. 702/64
7,298,148 B2 * 11/2007 Drake et al. .................. 324/421
(Continued)

FOREIGN PATENT DOCUMENTS

JP    61-126485 A    6/1986
JP    1-158365 A    6/1989
(Continued)

OTHER PUBLICATIONS

*Koryu Denshi Fuka Sochi PCZ1000A Catalog, Kikusui Electronics Corp. 2007, 5 pages.
*International Search Report (PCT/ISA/210) dated Mar. 10, 2009.
Office Action (Australian Examination Report) dated Feb. 23, 2012,
(Continued)

*Primary Examiner* — Arleen M Vazquez
*Assistant Examiner* — Feba Pothen
(74) *Attorney, Agent, or Firm* — Buchanan Ingersoll & Rooney PC

(57) ABSTRACT

A power measuring system, a measuring apparatus, a load terminal, and a device control system are provided. A voltage sensor detects a voltage waveform, and a current sensor acquires a current waveform, of a power line in a noncontact manner. A load terminal operates to connect the power line and a voltage measuring terminal to measure a current flowing from the power line to a load and to calculate a voltage value from the measured current value and the load. The load terminal transmits, in response to a request from a measuring apparatus, the measured current value and the calculated voltage value to the measuring apparatus via a communication means. A control portion of the measuring apparatus receives the current value and the voltage value from the load terminal. The control portion calculates a power value based on the received current value, voltage value voltage waveform and current waveform.

21 Claims, 11 Drawing Sheets

U.S. PATENT DOCUMENTS

| | | | | |
|---|---|---|---|---|
| 7,791,312 B2* | 9/2010 | Kook | | 320/108 |
| 7,795,877 B2* | 9/2010 | Radtke et al. | | 324/530 |
| 8,255,090 B2* | 8/2012 | Frader-Thompson et al. | | 700/295 |

FOREIGN PATENT DOCUMENTS

| | | |
|---|---|---|
| JP | 06-300790 A | 10/1994 |
| JP | 10-94162 A | 4/1998 |
| JP | 2000-338141 A | 12/2000 |
| JP | 2001-264356 A | 9/2001 |
| JP | 2002-55126 A | 2/2002 |
| JP | 2005-134233 A | 5/2005 |
| JP | 2007-205780 A | 8/2007 |

OTHER PUBLICATIONS issued by the Australian Patent Office in the corresponding Australian Application No. 2009211720. (2 pages).

Office Action from Chinese Patent Office dated Nov. 13, 2012, issued in corresponding Chinese Patent Application No. 200980102842.5, with English translation thereof.

Office Action from the Japan Patent Office dated Dec. 11, 2012, issued in corresponding Japanese Patent Application No. 2009-552481, with English translation thereof.

Office Action from Chinese Patent Office dated Mar. 22, 2013, issued in corresponding Chinese Patent Application No. 200980102842.5, with English translation thereof. (5 pages).

* cited by examiner

POWER MEASURING SYSTEM, MEASURING APPARATUS, LOAD TERMINAL, AND DEVICE CONTROL SYSTEM

TECHNICAL FIELD

The present invention relates to a power measuring system for measuring power consumed by electric devices in a noncontact manner, which are installed in general homes, shops, small-to-medium sized buildings, etc., as well as to a measuring apparatus and a load terminal constituting the power measuring system. The present invention also relates to a device control system for measuring power consumed by electric devices, which are installed in general homes, shops, small-to-medium sized buildings, etc., and for controlling states of the devices based on the measured results.

BACKGROUND ART

In order to measure power consumed by electric devices which are installed in general homes, shops, small-to-medium sized buildings, etc., it has hitherto been required for professionals to set up a power meter by attaching a voltage transformer or a current transformer to a distribution board, for example. Also, when power consumptions of devices are controlled in a demand system or the like to be held within a predetermined range, work for attaching a power or electrical energy measuring device has been required to be made by professionals, as in the above case, for the measurement of power. Thus, because installation of such a system entails electrical work, the installation needs professionals to carry out the electrical work and pushes up the cost. Further, when trying to install all-electrified appliances in an existing house, such a try has to be abandoned due to a limitation on current allowable for an indoor power line in many cases.

As a related art aiming to cope with the above-described problems, there is known a measuring method using a noncontact type voltmeter. In such a noncontact type voltmeter, a coating of an electric wire, i.e., a target of measurement, is surrounded by a conductor to constitute a capacitor. The conductor (capacitor) and the ground are connected to each other by using two probes of the noncontact type voltmeter. A current flowing between the conductor and the ground and a voltage therebetween are measured in a noncontact manner. Further, means for calculating a voltage correction coefficient is provided and a voltage measuring wire connected to the means is directly connected between a conductive-line exposed portion of the electric wire and the ground by using an alligator clip, for example, to measure a voltage with respect to the ground. The voltage of the electric wire, which has been obtained by the contact measurement, is compared with the voltage of the electric wire, which has been acquired from the noncontact type voltmeter, to determine a phase coefficient and a gain coefficient for the voltage of the electric wire automatically by using a PLL circuit or manually by using a variable capacitor or a variable resistor. The voltage measured in a noncontact manner is corrected based on those coefficients for proper calculation of the voltage (see, e.g., Patent Document 1).

Further, for the purpose of simplifying the work, there is known a measuring device in which a conductive voltage detecting portion having a sharp distal end is provided integrally with a current sensor unit constituting a closed magnetic circuit for easier mounting of the sensor unit (see, e.g., Patent Document 2).

Patent Document 1: Japanese Unexamined Patent Application Publication No. 2002-55126 (page 4 and FIGS. 1-2)

Patent Document 2: Japanese Unexamined Patent Application Publication No. 2005-134233 (pages 6-7 and FIGS. 1-7)

DISCLOSURE OF INVENTION

Problems to be Solved by the Invention

With the known noncontact type voltmeter disclosed in Patent Document 1, as described above, a voltage is calculated by setting the correction coefficient through calculation based on the result of the contact measurement, and by correcting the voltage measured in a noncontact manner. However, the known noncontact type voltmeter has problems in not only requiring operations of measuring the voltage in a contact manner and inputting a measured value to the voltmeter when set up, but also in requiring professionals who can handle the relevant devices when set up.

Also, the known measuring device disclosed in Patent Document 2 addresses the technique for facilitating the operation of mounting the voltage and current detecting portions. In practice, however, prevention of false wiring and easier installation of the measuring devices cannot be realized unless facilitation is achieved including, for example, electric wiring to determine power consumed by a power measuring portion other than the relevant measuring portion, and interface (hereinafter abbreviated to "I/F" in some cases) means that serves as means for taking out the measured values.

The present invention has been accomplished with the view of solving the above-described problems, and a first object of the present invention is to provide a power measuring system, a measuring apparatus, a load terminal, and a device control system, which need no special installation to be made by any skillful professionals, such as persons qualified for electrical work, by measuring voltage and current values in a noncontact manner when power consumed by electric devices, which are installed in general homes, shops, small-to-medium sized buildings, etc., is measured.

A second object is to provide a power measuring apparatus and a power measuring system, which are small in size and inexpensive.

Means for Solving the Problems

The power measuring system according to the present invention comprises a voltage sensor for detecting a voltage waveform of a power line in a noncontact manner through electrostatic coupling, a current sensor for detecting a current waveform of the power line in a noncontact manner through electromagnetic inductive coupling, a measuring apparatus including first communication means and a control portion which is connected to the voltage sensor and the current sensor, and a load terminal connected to the power line and including a load of a predetermined value and a measuring portion for measuring an effective value of a current flowing through the load and calculating an effective value of a voltage based on the measured effective value of the current, wherein the measuring portion of the load terminal transmits the effective value of the current and the effective value of the voltage to the measuring apparatus via the second communication means, and the control portion of the measuring apparatus calculates a power value based on the effective value of the current and the effective value of the voltage, which have been received from the load terminal via the first communication means, as well as on the voltage waveform acquired from the voltage sensor and the current waveform acquired from the current sensor.

Also, the power measuring apparatus according to the present invention comprises a current detector for detecting a current in an electric path to which an electric device is connected, an electric path contact for measuring a voltage of the electric path, a computing portion for calculating power consumed by the electric device based on an output from the current detector and an output from the electric path contact, and a power supply portion for receiving power from the electric path through the electric path contact and supplying power to the computing portion, wherein the power supply portion is constituted by a circuit that is not isolated from the electric path.

ADVANTAGES

With the present invention, the power measuring system comprises a voltage sensor for detecting a voltage waveform of a power line in a noncontact manner through electrostatic coupling, a current sensor for detecting a current waveform of the power line in a noncontact manner through electromagnetic inductive coupling, a measuring apparatus including first communication means and a control portion which is connected to the voltage sensor and the current sensor, and a load terminal connected to the power line and including a load of a predetermined value and a measuring portion for measuring an effective value of a current flowing through the load and calculating an effective value of a voltage based on the measured effective value of the current, wherein the measuring portion of the load terminal transmits the effective value of the current and the effective value of the voltage to the measuring apparatus via the second communication means, and the control portion of the measuring apparatus calculates a power value based on the effective value of the current and the effective value of the voltage, which have been received from the load terminal via the first communication means, as well as on the voltage waveform acquired from the voltage sensor and the current waveform acquired from the current sensor. Thus, since the power measuring system is constituted to be able to measure power of a basic power line system in a noncontact manner, any skillful work is no longer required to install the power measuring device on the basic power line. Further, a manual energy saving system, a demand control system, a peak cut system, etc., which operate with the use of a device for monitoring power consumption, can be introduced at a lower cost. As a result, more widespread use and development of those systems are expected.

In addition, since the power supply circuit having the non-isolated structure is disposed inside the power measuring apparatus, the power measuring apparatus can be inexpensively and easily installed and can be reduced in size.

BEST MODES FOR CARRYING OUT THE INVENTION

EXAMPLE 1

Figure 1:
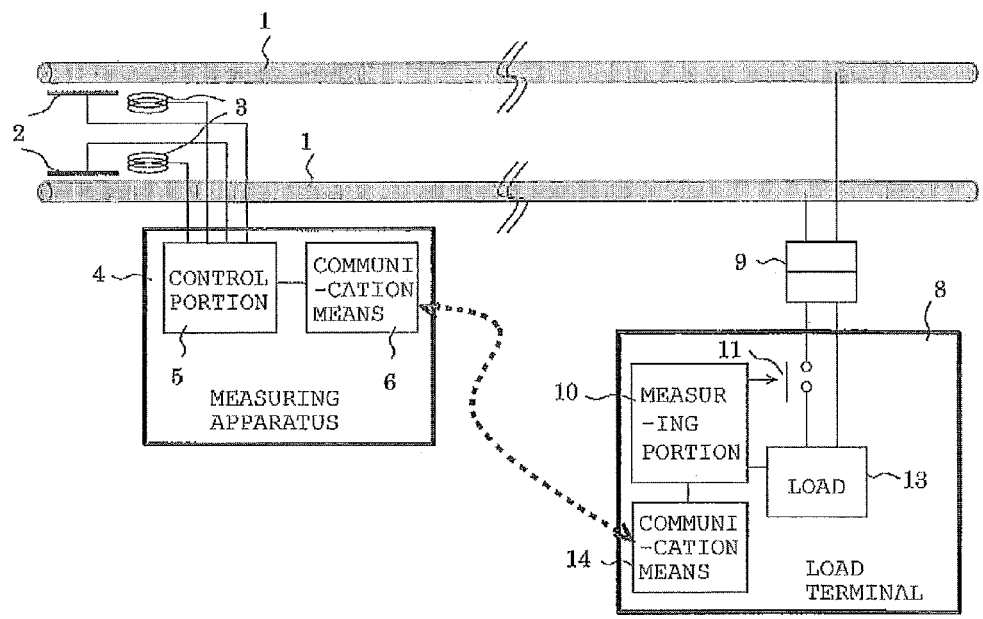
FIG. 1 illustrates the configuration of a power measuring system according to EXAMPLE 1 of the present invention.

FIG. 1 illustrates the configuration of a power measuring system according to EXAMPLE 1 of the present invention. In FIG. 1, reference numeral 1 denotes a power line for supplying power to an electric device, 2 denotes a voltage sensor for observing a voltage waveform between two power lines 2 through electrostatic coupling, and 3 denotes a current sensor for observing, through electromagnetic coupling, a magnetic flux generated by a current that flows through each power line 1 due to a load including the electric device, etc., and for observing a current waveform. In the case of a general home, the voltage sensor 2 and the current sensor 3 are installed, for example, near an indoor-side wiring connection point in a main breaker of a distribution board. Reference numeral 4 denotes a measuring apparatus comprising a control portion 5 and communication means 6 for communicating with a load terminal 8. The voltage sensor 2 and the current sensor 3 are connected to the control portion 5, and the control portion 5 executes calculation of power. Reference numeral 8 denotes a load terminal that is connected to each power line 1 through a receptacle (socket) and a receptacle plug 9. The load terminal 8 comprises a measuring portion 10, a load 13 such as a resistance having a predetermined value, contact means 11 for turning on/off (closing or opening) connection of the power line 1 to the load 13, and communication means 14 to perform communication with the measuring apparatus 4.

The operation of EXAMPLE 1 will be described below with reference to FIG. 1.

When installed, the control portion 5 of the measuring apparatus 4 initially transmits, to the load terminal 8 via the communication means 6, a command for closing (turning "on") the contact means 11 of the load terminal 8. Upon receiving the command for turning "on" the contact means 11 via the communication means 14, the measuring portion 10 of the load terminal closes the contact means 11 for connection of the load 13 to the power line 1, measures a value of a current (effective value of a current) flowing through the load 13, and stores the measured value in a built-in memory. Further, the measuring portion 10 multiplies the measured current value by the impedance of the load 13 to calculate a voltage value (effective value of a voltage) and stores the calculated value in the built-in memory. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a command for opening (turning "off") the contact means 11. Upon receiving the command for turning "off" the contact means 11 via the communication means 14, the measuring portion 10 of the load terminal 8 opens the contact means 11. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a request for monitoring the current value and the voltage value, which have been measured and calculated in the above-described manners. Upon receiving the monitoring request via the communication means 14, the measuring portion 10 of the load terminal 8 transmits both the current value and the voltage value, which are stored in the built-in memory, to the measuring apparatus 4 via the communication means 14. The control portion 5 of the measuring apparatus 4 receives the current value and the voltage value from the load terminal 8 via the communication means 6, and further calculates a power value Ps in the "closed" state from both the voltage waveform and the current waveform, which have been acquired when the contact means 11 is "closed".

Next, the control portion 5 of the measuring apparatus 4 calculate a power value Po in the "open" state from both the voltage waveform and the current waveform, which have been acquired when the contact means 11 is "opened". Further, the control portion 5 subtracts Po from Ps to calculate a power value Pd that is substantially proportional to power consumed by the load terminal 8. The control portion 5 of the measuring apparatus 4 repeats the process of closing and opening the contact means 11 of the load terminal 8, acquiring the voltage waveform, and acquiring the current waveform several times, thus calculating a mean value of several power values Pd. On that occasion, the power consumed by the load terminal 8 is obtained, as a power value Pdm measured by the measuring apparatus 4 by using the voltage sensor 2 and the current sensor 3, after reducing a change attributable to power consumed by other electric devices than the load terminal 8 through the steps of, for example, excluding one or more among the power values resulting from several repeated measurements, which differ from the mean value to a large extent, and taking a mean value of the remaining data.

Next, the control portion 5 calculates a power value Pr consumed by the load terminal 8 from the current value and the voltage value, which have been obtained from the load terminal B. Further, the control portion 5 calculates a correction coefficient α based on the following formula (1) and determines the correction coefficient to be α, which is used when the measuring apparatus 4 calculates power.

$$Pr = \alpha \times Pdm$$

$$\therefore \alpha = Pr/Pdm \quad (1)$$

The foregoing is the operation executed in the initial stage of the installation. The operation in measuring power will be described below.

The measuring apparatus 4 starts the power measurement after the correction coefficient α has been determined. In the power measurement, power consumed by the power line 1 is calculated by multiplying the result of multiplication between the voltage waveform observed with the voltage sensor 2 and the current waveform observed with the current sensor 3 by the correction coefficient α.

As described above, the power can be measured just by connecting the load terminal 8 to the receptacle or the like, arranging the measuring apparatus 4 near a basic line, and arranging the voltage sensor 2 and the current sensor 3, which are each of the noncontact type, near the power line 1. Therefore, the power measurement can be performed with no need of any work by professionals skilled in the art.

Although materials used for the voltage sensor 2 are not mentioned above, a film containing a sheet-like metallic material, a metallic split ring, a metallic clip, a conductive sheet, etc. can be used. Also, generally used current sensors including an air-core coil, a coil surrounded around a split core, a film coil manufactured by using a film substrate or the like, a magneto-electric transducer for converting a magnetic flux to an electric signal, such as a Hall device, etc. can be utilized as the current sensor 3.

Further, although a communication technique used in the communicating portion is not particularly designated, the communication technique can be practiced, for example, by using a power-line carrier communication technique, a wireless communication technique, and a wired communication technique using paired lines, etc. In the case of a visually reachable range, the function and advantages similar to those described above can also be obtained by using, e.g., an infrared communication technique.

In this EXAMPLE 1, the power line 1 is described as a two-wire line. In the case of a single-phase three-wire line, as another example, the power measurement can be performed in a similar manner by arranging the voltage sensor between each phase and a neutral line, arranging the current sensor for each phase, connecting one load terminal to a receptacle for each phase, and determining the correction coefficient for each phase.

EXAMPLE 2

Figure 2:
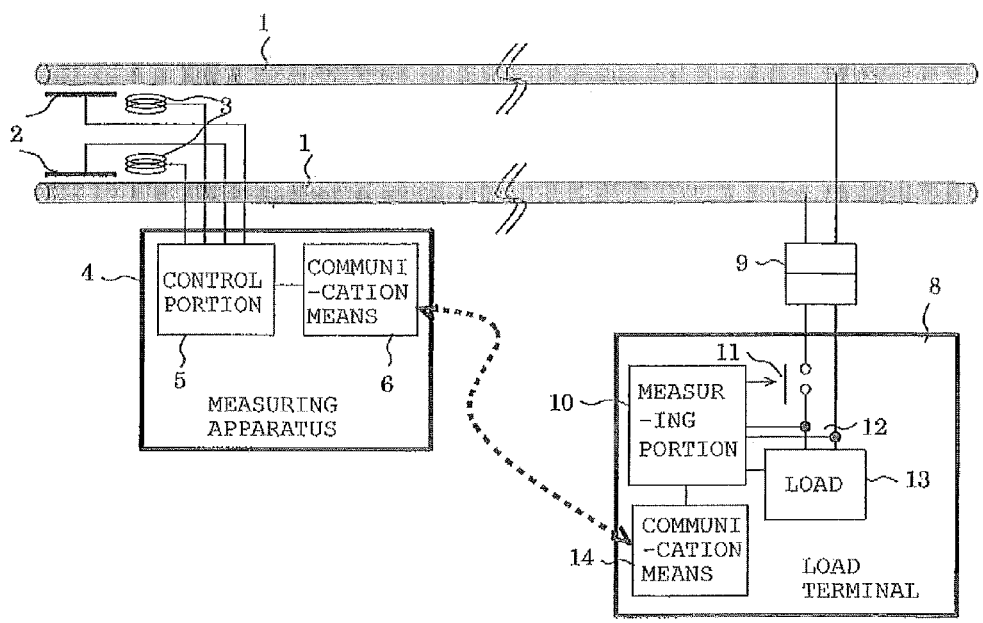
FIG. 2 illustrates the configuration of a power measuring system according to EXAMPLE 2 of the present invention.

FIG. 2 illustrates the configuration of a power measuring system according to EXAMPLE 2 of the present invention. In FIG. 2, reference numeral 1 denotes a power line for supplying power to an electric device, 2 denotes a voltage sensor for observing a voltage waveform between two power lines 2 through electrostatic coupling, and 3 denotes a current sensor for observing, through electromagnetic coupling, a magnetic flux generated by a current that flows through the power line 1 due to a load including the electric device, etc., and for observing a current waveform. In the case of a general home, the voltage sensor 2 and the current sensor 3 are installed, for example, near an indoor-side wiring connection point in a main breaker of a distribution board. Reference numeral 4 denotes a measuring apparatus comprising a control portion 5 and communication means 6 for communicating with a load terminal 8. The voltage sensor 2 and the current sensor 3 are connected to the control portion 5, and the control portion 5 executes calculation of power. Reference numeral 8 denotes a load terminal that is connected to the power line 1 through a receptacle (socket) and a receptacle plug 9. The load terminal 8 comprises a measuring portion 10, a voltage measuring terminal 12, a load 13 such as a resistor having a predetermined value, contact means 11 for turning on/off (closing or opening) connection of the power line 1 to the load 13, and communication means 14 to perform communication with the measuring apparatus 4.

The operation of EXAMPLE 2 will be described below with reference to FIG. 2.

When installed, the measuring apparatus 4 initially transmits, to the load terminal 8 via the communication means 6, a command for closing (turning "on") the contact means 11 of the load terminal 8. Upon receiving the command for turning "on" the contact means 11 via the communication means 14, the measuring portion 10 of the load terminal closes the contact means 11 for connection of the load 13 to the power line 1, measures a value of a current flowing through the load 13, and stores the measured value in a built-in memory. Further, the measuring portion 10 measures a voltage value between both ends of the voltage measuring terminal 12 and stores the measured value in the built-in memory. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a command for opening (turning "off") the contact means 11. Upon receiving the command for turning "off" the contact means 11 via the communication means 14, the measuring portion 10 of the load terminal 8 opens the contact means 11. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a request for monitoring the current value and the voltage value, which have been measured in the above-described manners. Upon receiving the monitoring request via the communication means 14, the measuring portion 10 of the load terminal 8 transmits both the current value and the voltage value, which are stored in the built-in memory, to the measuring apparatus 4 via the communication means 14. The control portion 5 of the measuring apparatus 4 receives the current value and the voltage value from the load terminal 8 via the communication means 6, and further calculates a power value Ps in the "closed" state from both the voltage waveform and the current waveform, which have been acquired when the contact means 11 is "closed".

Next, the control portion 5 of the measuring apparatus 4 calculate a power value Po in the "open" state from both the voltage waveform and the current waveform, which have been acquired when the contact means 11 is "opened". Further, the control portion 5 subtracts Po from Ps to calculate a power value Pd that is substantially proportional to power consumed by the load terminal 8. The control portion 5 of the measuring apparatus 4 repeats the process of closing and opening the contact means 11 of the load terminal 8, acquiring the voltage waveform, and acquiring the current waveform several times, thus calculating a mean value of several power values Pd. On that occasion, the power consumed by the load terminal 8 is obtained, as a power value Pdm measured by the measuring apparatus 4 by using the voltage sensor 2 and the current sensor 3, after reducing a change attributable to power consumed by other electric devices than the load terminal 8 through the steps of, for example, excluding one or more among the power values resulting from several repeated measurements, which differ from the mean value to a large extent, and taking a mean value of the remaining data.

Next, the control portion 5 calculates a power value Pr consumed by the load terminal 8 from the current value and the voltage value, which have been obtained from the load terminal 8. Further, the control portion 5 calculates a correction coefficient α based on the following formula (1) and determines the correction coefficient to be α, which is used when the measuring apparatus 4 calculates power.

$$Pr = \alpha \times Pdm$$

$$\therefore \alpha = Pr/Pdm \qquad (1)$$

The foregoing is the operation executed in the initial stage of the installation. The operation in measuring power will be described below.

The measuring apparatus 4 starts the power measurement after the correction coefficient α has been determined. In the power measurement, power consumed by the power line 1 is calculated by multiplying the result of multiplication between the voltage waveform observed with the voltage sensor 2 and the current waveform observed with the current sensor 3 by the correction coefficient α.

As described above, the power can be measured just by connecting the load terminal 8 to the receptacle or the like, arranging the measuring apparatus 4 near a basic line, and arranging the voltage sensor 2 and the current sensor 3, which are each of the noncontact type, near the power line 1. Therefore, the power measurement can be performed with no need of any work by professionals skilled in the art.

Although materials used for the voltage sensor 2 are not mentioned above, a film containing a sheet-like metallic material, a metallic split ring, a metallic clip, a conductive sheet, etc. can be used. Also, generally used current sensors including an air-core coil, a coil surrounded around a split core, a film coil manufactured by using a film substrate or the like, a magneto-electric transducer for converting a magnetic flux to an electric signal, such as a Hall device, etc. can be utilized as the current sensor 3.

Further, although a communication technique used in the communicating portion is not particularly designated, the communication technique can be practiced, for example, by using a power-line carrier communication technique, a wireless communication technique, and a wired communication technique using paired lines, etc. In the case of a visible range, the function and advantages similar to those described above can also be obtained by using, e.g., an infrared communication technique.

In this EXAMPLE 2, the power line 1 is described as a two-wire line. In the case of a single-phase three-wire line, as another example, the power measurement can be performed in a similar manner by arranging the voltage sensor between each phase and a neutral line, arranging the current sensor for each phase, connecting one load terminal to a receptacle for each phase, and determining the correction coefficient for each phase.

EXAMPLE 3

Figure 3:
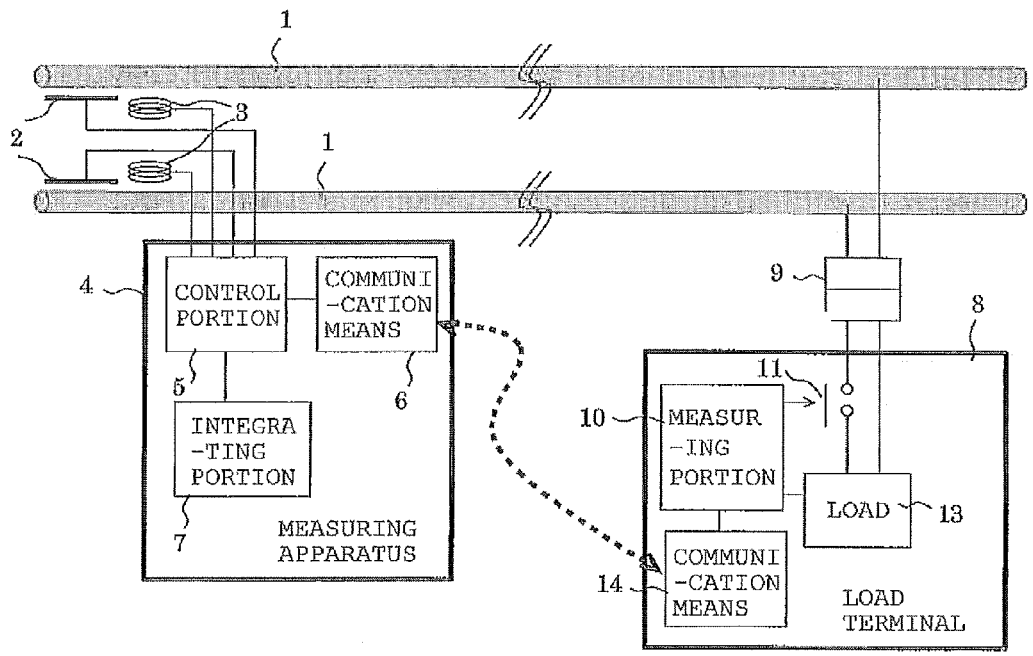
FIG. 3 illustrates the configuration of a power measuring system according to EXAMPLE 3 of the present invention.

FIG. 3 illustrates the configuration of a power measuring system according to EXAMPLE 3 of the present invention. In FIG. 3, reference numeral 1 denotes a power line for supplying power to an electric device, 2 denotes a voltage sensor for observing a voltage waveform between two power lines 2 through electrostatic coupling, and 3 denotes a current sensor for observing, through electromagnetic coupling, a magnetic flux generated by a current that flows through each power line 1 due to a load including the electric device, etc., and for observing a current waveform. In the case of a general home, the voltage sensor 2 and the current sensor 3 are installed, for example, near an indoor-side wiring connection point in a main breaker of a distribution board. Reference numeral 4 denotes a measuring apparatus comprising a control portion 5 and communication means 6 for communicating with a load terminal 8. The voltage sensor 2 and the current sensor 3 are connected to the control portion 5, and the control portion 5 executes calculation of power. Reference numeral 7 denotes an integrating portion for integrating the measured power value for a predetermined time to obtain electric energy (i.e., accumulative amount of power). Reference numeral 8 denotes a load terminal that is connected to each power line 1 through a receptacle (socket) and a receptacle plug 9. The load terminal 8 comprises a measuring portion 10, a load 13 such as a resistance having a predetermined value, contact means 11 for turning on/off (closing or opening) connection of the power line 1 to the load 13, and communication means 14 to perform communication with the measuring apparatus 4.

The operation of EXAMPLE 3 will be described below with reference to FIG. 3.

When installed, the measuring apparatus 4 initially transmits, to the load terminal 8 via the communication means 6, a command for closing (turning "on") the contact means 11 of the load terminal 8. Upon receiving the command for turning "on" the contact means 11 via the communication means 14, the measuring portion 10 of the load terminal closes the contact means 11 for connection of the load 13 to the power line 1, measures a value of a current flowing through the load 13, and stores the measured value in a built-in memory. Further, the measuring portion 10 multiplies the measured current value by the impedance of the load 13 to calculate a voltage value and stores the calculated value in the built-in memory. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a command for opening (turning "off") the contact means 11. Upon receiving the command for turning "off" the contact means 11 via the communication means 14, the measuring portion 10 of the load terminal 8 opens the contact means 11. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a request for monitoring the current value and the voltage value, which have been measured and calculated in the above-described manners. Upon receiving the monitoring request via the communication means 14, the measuring portion 10 of the load terminal 8 transmits both the current value and the voltage value, which are stored in the built-in memory, to the measuring apparatus 4 via the communication means 14. The control portion 5 of the measuring apparatus 4 receives the current value and the voltage value from the load terminal 8 via the communication means 6, and further calculates a power value Ps in the "closed" state from both the voltage waveform and the current waveform, which have been acquired when the contact means 11 is "closed".

Next, the control portion 5 of the measuring apparatus 4 calculate a power value Po in the "open" state from both the voltage waveform and the current waveform, which have been acquired when the contact means 11 is "opened". Further, the control portion 5 subtracts Po from Ps to calculate a power value Pd that is substantially proportional to power consumed by the load terminal 8. The control portion 5 of the measuring apparatus 4 repeats the process of closing and opening the contact means 11 of the load terminal 8, acquiring the voltage waveform, and acquiring the current waveform several times, thus calculating a mean value of power values Pd. Thereby, the power consumed by the load terminal 8 is obtained, as a power value Pdm measured by the measuring apparatus 4 by using the voltage sensor 2 and the current sensor 3, after reducing a change attributable to power consumed by other electric devices than the load terminal 8 through the steps of, for example, excluding one or more among the power values resulting from several repeated measurements, which differ from the mean value to a large extent, and taking a mean value of the remaining data.

Next, the control portion 5 calculates a power value Pr consumed by the load terminal 8 from the current value and the voltage value, which have been obtained from the load terminal 8. Further, the control portion 5 calculates a correction coefficient α based on the following formula (1) and determines the correction coefficient to be α, which is used when the measuring apparatus 4 calculates power.

$$Pr = \alpha \times Pdm$$

$$\therefore \alpha = Pr/Pdm \qquad (1)$$

The foregoing is the operation executed in the initial stage of the installation. The operation in measuring power will be described below.

The measuring apparatus 4 starts the power measurement after the correction coefficient α has been determined. In the power measurement, power consumed by the power line 1 is calculated by multiplying the result of multiplication between the voltage waveform observed with the voltage sensor 2 and the current waveform observed with the current sensor 3 by the correction coefficient α.

Next, the control portion 5 inputs a calculated value of the power consumed by the power line 1 to the integrating portion 7. The integrating portion 7 accumulates the input power value for the predetermined time to obtain electric energy.

As described above, the electric energy can be measured just by connecting the load terminal 8 to the receptacle or the like, arranging the measuring apparatus 4 near a basic line, and arranging the voltage sensor 2 and the current sensor 3, which are each of the noncontact type, near the power line 1. Therefore, the electric energy measurement can he performed with no need of any work by professionals skilled in the art.

Although materials used for the voltage sensor 2 are not mentioned above, a film containing a sheet-like metallic material, a metallic split ring, a metallic clip, a conductive sheet, etc. can be used. Also generally used current sensors including an air-core coil, a coil surrounded around a split core, a film coil manufactured by using a film substrate or the like, a magneto-electric transducer for converting a magnetic flux to an electric signal, such as a Hall device, etc. can be utilized as the current sensor 3.

Further, although a communication technique used in the communicating portion is not particularly designated, the communication technique can be practiced, for example, by using a power-line carrier communication technique, a wireless communication technique, and a wired communication technique using paired lines, etc. In the case of a visually reachable range, the function and advantages similar to those described above can also be obtained by using, e.g., an infrared communication technique.

In this EXAMPLE 3, the power line 1 is described as a two-wire line. In the case of a single-phase three-wire line, as another example, the electric energy measurement can be performed in a similar manner by arranging the voltage sensor between each phase and a neutral line, arranging the current sensor for each phase, connecting one load terminal to a receptacle for each phase, and determining the correction coefficient for each phase.

EXAMPLE 4

Figure 4:
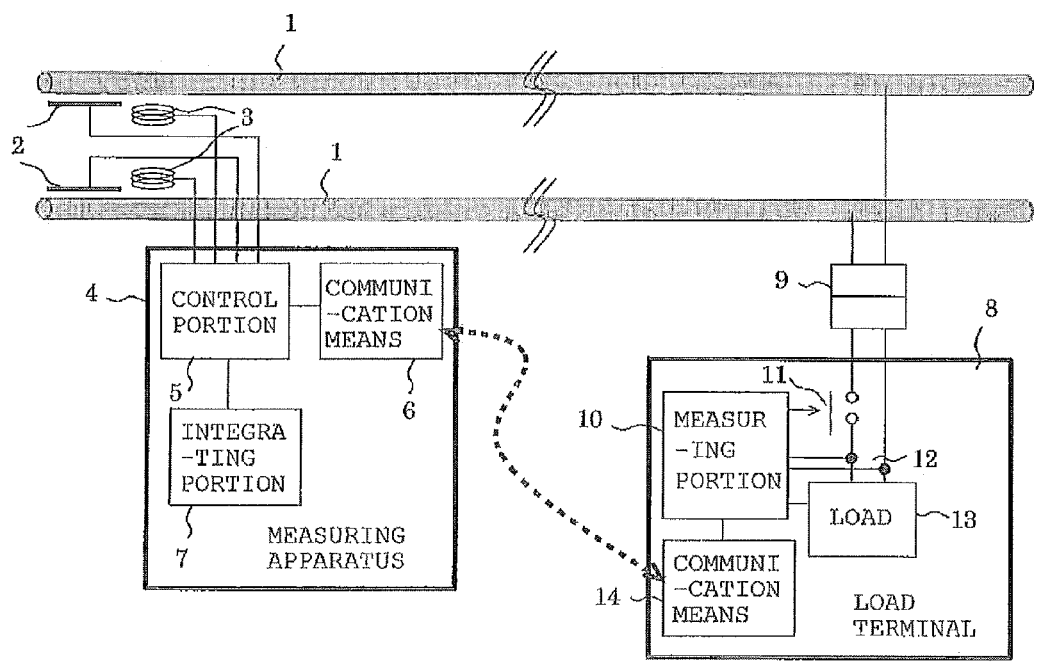
FIG. 4 illustrates the configuration of a power measuring system according to EXAMPLE 4 of the present invention.

FIG. 4 illustrates the configuration of a power measuring system according to EXAMPLE 2 of the present invention. In FIG. 4, reference numeral 1 denotes a power line for supplying power to an electric device, 2 denotes a voltage sensor for observing a voltage waveform between two power lines 2 through electrostatic coupling, and 3 denotes a current sensor for observing, through electromagnetic coupling, a magnetic flux generated by a current that flows through each power line 1 due to a load including the electric device, etc., and for observing a current waveform. In the case of a general home, the voltage sensor 2 and the current sensor 3 are installed, for example, near an indoor-side wiring connection point in a main breaker of a distribution board. Reference numeral 4 denotes a measuring apparatus comprising a control portion 5 and communication means 6 for communicating with a load terminal 8. The voltage sensor 2 and the current sensor 3 are connected to the control portion 5, and the control portion 5 executes calculation of power. Reference numeral 7 denotes an integrating portion for integrating the measured power value for a predetermined time to obtain electric energy (i.e., an accumulative amount of power). Reference numeral 8 denotes a load terminal that is connected to each power line 1 through a receptacle (socket) and a receptacle plug 9. The load terminal 8 comprises a measuring portion 10, a voltage measuring terminal 12, a load 13 such as a resistance having a predetermined value, contact means 11 for turning on/off (closing or opening) connection of the power line 1 to the load 13, and communication means 14 to perform communication with the measuring apparatus 4.

The operation of EXAMPLE 4 will be described below with reference to FIG. 4.

When installed, the measuring apparatus 4 initially transmits, to the load terminal 8 via the communication means 6, a command for closing (turning "on") the contact means 11 of the load terminal 8. Upon receiving the command for turning the contact means 11 via the communication means 14, the measuring portion 10 of the load terminal closes the contact means 11 for connection of the load 13 to the power line 1, measures a value of a current flowing through the load 13, and stores the measured value in a built-in memory. Further, the measuring portion 10 measures a voltage value between both ends of the voltage measuring terminal 12 and stores the measured value in the built-in memory. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a command for opening (turning "off") the contact means 11. Upon receiving the command for turning "off" the contact means 11 via the communication means 14, the measuring portion 10 of the load terminal 8 opens the contact means 11. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a request for monitoring the current value and the voltage value, which have been measured in the above-described manners. Upon receiving the monitoring request via the communication means 14, the measuring portion 10 of the load terminal 8 transmits both the current value and the voltage value, which are stored in the built-in memory, to the measuring apparatus 4 via the communication means 14. The control portion 5 of the measuring apparatus 4 receives the current value and the voltage value from the load terminal 8 via the communication means 6, and further calculates a power value Ps in the "closed" state from both the voltage waveform and the current waveform, which have been acquired when the contact means 11 is "closed".

Next, the control portion 5 of the measuring apparatus 4 calculate a power value Po in the "open" state from both the voltage waveform and the current waveform, which have been acquired when the contact means 11 is "opened". Further, the control portion 5 subtracts Po from Ps to calculate a power value Pd that is substantially proportional to power consumed by the load terminal 8. The control portion 5 of the measuring apparatus 4 repeats the process of closing and opening the contact means 11 of the load terminal 8, acquiring the voltage waveform, and acquiring the current waveform several times, thus calculating a mean value of several power values Pd. On that occasion, the power consumed by the load terminal 8 is obtained, as a power value Pdm measured by the measuring apparatus 4 by using the voltage sensor 2 and the current sensor 3, after reducing a change attributable to power consumed by other electric devices than the load terminal 8 through the steps of, for example, excluding one or more among the power values resulting from several repeated measurements, which differ from the mean value to a large extent, and taking a mean value of the remaining data.

Next, the control portion 5 calculates a power value Pr consumed by the load terminal 8 from the current value and the voltage value, which have been obtained from the load terminal 8. Further, the control portion 5 calculates a correction coefficient α based on the following formula (1) and determines the correction coefficient to be α, which is used when the measuring apparatus 4 calculates power.

$$Pr = \alpha \times Pdm$$
$$\therefore \alpha = Pr/Pdm \qquad (1)$$

The foregoing is the operation executed in the initial stage of the installation. The operation in measuring power will be described below.

The measuring apparatus 4 starts the power measurement after the correction coefficient α has been determined. In the power measurement, power consumed by the power line 1 is calculated by multiplying the result of multiplication between the voltage waveform observed with the voltage sensor 2 and the current waveform observed with the current sensor 3 by the correction coefficient α. Next, the control portion 5 inputs a calculated value of the power consumed by the power line 1 to the integrating portion 7. The integrating portion 7 accumulates the input power value for the predetermined time to obtain electric energy.

As described above, the electric energy can be measured just by connecting the load terminal 8 to the receptacle or the like, arranging the measuring apparatus 4 near a basic line, and arranging the voltage sensor 2 and the current sensor 3, which are each of the noncontact type, near the power line 1. Therefore, the electric energy measurement can be performed with no need of any work by professionals skilled in the art.

Although materials used for the voltage sensor 2 are not mentioned above, a film containing a sheet-like metallic material, a metallic split ring, a metallic clip, a conductive sheet, etc. can be used. Also, generally used current sensors including an air-core coil, a coil surrounded around a split core, a film coil manufactured by using a film substrate or the like, a magneto-electric transducer for converting a magnetic flux to an electric signal, such as a Hall device, etc. can be utilized as the current sensor 3.

Further, although a communication technique used in the communicating portion is not particularly designated, the communication technique can be practiced, for example, by using a power-line carrier communication technique, a wireless communication technique, and a wired communication technique using paired lines, etc. In the case of a visually reachable range, the function and advantages similar to those described above can also be obtained by using, e.g., an infrared communication technique.

In this EXAMPLE 4, the power line 1 is described as a two-wire line. In the case of a single-phase three-wire line, as another example, the electric energy measurement can be performed in a similar manner by arranging the voltage sensor between each phase and a neutral line, arranging the current sensor for each phase, connecting one load terminal to a receptacle for each phase, and determining the correction coefficient for each phase.

EXAMPLE 5

Figure 5:
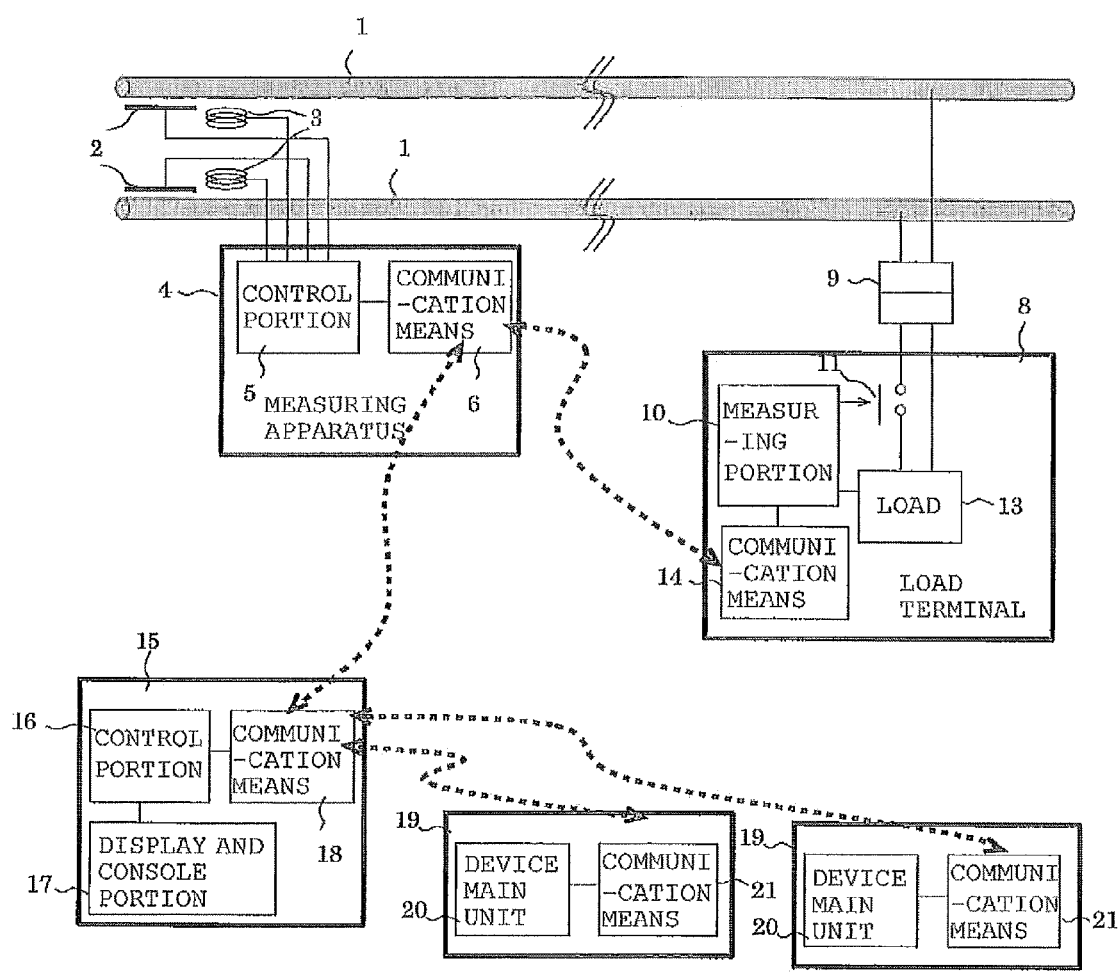
FIG. 5 illustrates the configuration of a device control system according to EXAMPLE 5 of the present invention.

FIG. 5 illustrates the configuration of a device control system according to EXAMPLE 5 of the present invention. In FIG. 5, reference numeral 1 denotes a power line for supplying power to an electric device, 2 denotes a voltage sensor for observing a voltage waveform between two power lines 2 through electrostatic coupling, and 3 denotes a current sensor for observing, through electromagnetic coupling, a magnetic flux generated by a current that flows through the power line 1 due to a load including the electric device, etc., and for observing a current waveform.

In the case of a general home, the voltage sensor 2 and the current sensor 3 are installed, for example, near an indoor-side wiring connection point in a main breaker of a distribution board. Reference numeral 4 denotes a measuring apparatus comprising a control portion 5 and communication means 6 for communicating with a load terminal 8 and other terminals. The voltage sensor 2 and the current sensor 3 are connected to the control portion 5, and the control portion 5 executes calculation of power. Reference numeral 8 denotes a load terminal that is connected to the power line 1 through a receptacle (socket) and a receptacle plug 9. The load terminal 8 comprises a measuring portion 10, a load 13 such as a resistor having a predetermined value, contact means 11 for turning on/off (closing or opening) connection of the power line 1 to the load 13, and communication means 14 to perform communication with the measuring apparatus 4 and the other terminals.

Reference numeral 15 denotes a controller comprising a control portion 16, a display and console portion 17, and communication means 18. The controller 15 controls the state of an electric device 19 based on the measured power value obtained from the measuring apparatus 4, etc. The electric device 19 comprises a device main unit 20 and communication means 21 for communicating with the controller.

The electric device 19 may be constructed in the form that the device main unit 20 and the communication means 21 are integral with each other, or that the communication means 21 is connected to the device main unit 20 through an adapter, for example.

The operation of EXAMPLE 5 will be described below with reference to FIG. 5.

When installed, the measuring apparatus 4 initially transmits, to the load terminal 8 via the communication means 6, a command for closing (turning "on") the contact means 11 of the load terminal 8. Upon receiving the command for turning "on" the contact means 11 via the communication means 14, the measuring portion 10 of the load terminal closes the contact means 11 for connection of the load 13 to the power line 1, measures a value of a current flowing through the load 13, and stores the measured value in a built-in memory. Further, the measuring portion 10 multiplies the measured current value by the impedance of the load 13 to calculate a voltage value and stores the calculated value in the built-in memory. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a command for opening (turning "off") the contact means 11. Upon receiving the command for turning "off" the contact means 11 via the communication means 14, the measuring portion 10 of the load terminal 8 opens the contact means 11. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a request for monitoring the current value and the voltage value, which have been measured and calculated in the above-described manners. Upon receiving the monitoring request via the communication means 14, the measuring portion 10 of the load terminal 8 transmits both the current value and the voltage value, which are stored in the built-in memory, to the measuring apparatus 4 via the communication means 14. The control portion 5 of the measuring apparatus 4 receives the current value and the voltage value from the load terminal 8 via the communication means 6, and further calculates a power value Ps in the "closed" state from both the voltage waveform and the current waveform, which have been acquired when the contact means 11 is "closed".

Next, the control portion 5 of the measuring apparatus 4 calculate a power value Po in the "open" state from both the voltage waveform and the current waveform, which have been acquired when the contact means 11 is "opened". Further, the control portion 5 subtracts Po from Ps to calculate a power value Pd that is substantially proportional to power consumed by the load terminal 8. The control portion 5 of the measuring apparatus 4 repeats the process of closing and opening the contact means 11 of the load terminal 8, acquiring the voltage waveform, and acquiring the current waveform several times, thus calculating a mean value of power values Pd. Thereby, the power consumed by the load terminal 8 is obtained, as a power value Pdm measured by the measuring apparatus 4 by using the voltage sensor 2 and the current sensor 3, after reducing a change attributable to power consumed by other electric devices than the load terminal 8 through the steps of, for example, excluding one or more among the power values resulting from several repeated measurements, which differ from the mean value to a large extent, and taking a mean value of the remaining data.

Next, the control portion 5 calculates a power value Pr consumed by the load terminal 8 from the current value and the voltage value, which have been obtained from the load terminal 8. Further, the control portion 5 calculates a correction coefficient α based on the following formula (1) and determines the correction coefficient to be α, which is used when the measuring apparatus 4 calculates power.

$$Pr = \alpha \times Pdm$$

$$\therefore \alpha = Pr/Pdm \quad (1)$$

The foregoing is the operation executed in the initial stage of the installation. The operation in measuring power will be described below.

The measuring apparatus 4 starts the power measurement after the correction coefficient α has been determined. In the power measurement, power consumed by the power line 1 is calculated by multiplying the result of multiplication between the voltage waveform observed with the voltage sensor 2 and the current waveform observed with the current sensor 3 by the correction coefficient α.

The controller 15 receives the measured power value from the measuring apparatus 4 via the communication means 18 at predetermined time intervals. Also, the controller 15 receives the operation status of the electric device 19 from the electric device 19 via the communication means 18 at predetermined time intervals. Further, when the operating state of the electric device 19 is changed with, e.g., an input operation made on the device main unit 20, the device main unit 20 of the electric device 19 transmits a notice indicating the change of the state to the controller 15 via the communication means 21. Thus, the controller 15 holds the consumed electric energy and the operating status of the electric device 19. In the controller 15, there are set an upper limit value of power and priority for each electric device 19 with input operations made on the display and console portion 17. For example, if the power value acquired from the measuring apparatus 4 exceeds the set upper limit value of electric energy, the control portion 16 of the controller 15 transmits, based on the priority set for each electric device 19, a control signal to one of the electric devices 19 via the communication means 18 for restricting a value of power or current for operating the main unit of the one electric device 19 having the lowest priority so that the measured power value is kept at or below the upper limit value of power.

Further, when another electric device 19 is going to start the operation while one electric device 19 is in the operation state, the other electric device 19 transmits information indicating the start of the operation to the controller 15. At that time, the controller 15 estimates a total power value in the case where the other electric device 19 would come into the operation, based on the measured power value and the power consumed by the electric device 19 going to start the operation, the latter being registered in advance or obtained from preset operation information. For example, if the estimated power value exceeds the contract demand, the controller 15 transmits a command to the relevant electric device 19 via the communication means 18 to disallow the operation or restrict a value of power for operating the electric device 19 that is going to start the operation, or to stop the operation or restrict a value of power for operating the electric device 19 that is already in the operation state. As a result, the total power value is controlled to be held at a predetermined value or below.

Thus, the device control system of EXAMPLE 5 controls the electric devices such that the power value will not exceed a certain level.

As described above, the power can be measured just by connecting the load terminal 8 to the receptacle or the like, arranging the measuring apparatus 4 near a basic line, and arranging the voltage sensor 2 and the current sensor 3, which are each of the noncontact type, near the power line 1. In addition, a system for controlling the electric devices to be operated within a predetermined range of power value based on the measured power values can be constructed with no need of any work by professionals skilled in the art.

Although materials used for the voltage sensor 2 are not mentioned above, a film containing a sheet-like metallic material, a metallic split ring, a metallic clip, a conductive sheet, etc. can be used. Also, generally used current sensors including an air-core coil, a coil surrounded around a split core, a film coil manufactured by using a film substrate or the like, a magneto-electric transducer for converting a magnetic flux to an electric signal, such as a Hall device, etc. can be utilized as the current sensor 3.

Further, although a communication technique used in the communicating portion is not particularly designated, the communication technique can be practiced, for example, by using a power-line carrier communication technique, a wireless communication technique, and a wired communication technique using paired lines, etc. In the case of a visually reachable range, the function and advantages similar to those described above can also be obtained by using, e.g., an infrared communication technique.

In this EXAMPLE 5, the power line 1 is described as a two-wire line. In the case of a single-phase three-wire line, as another example, the power measurement can be performed in a similar manner by arranging the voltage sensor between each phase and a neutral line, arranging the current sensor for each phase, connecting one load terminal to a receptacle for each phase, and determining the correction coefficient for each phase. Further, the operation control system for the electric devices can be constructed in a similar manner by performing the power measurement with such an arrangement.

EXAMPLE 6

Figure 6:
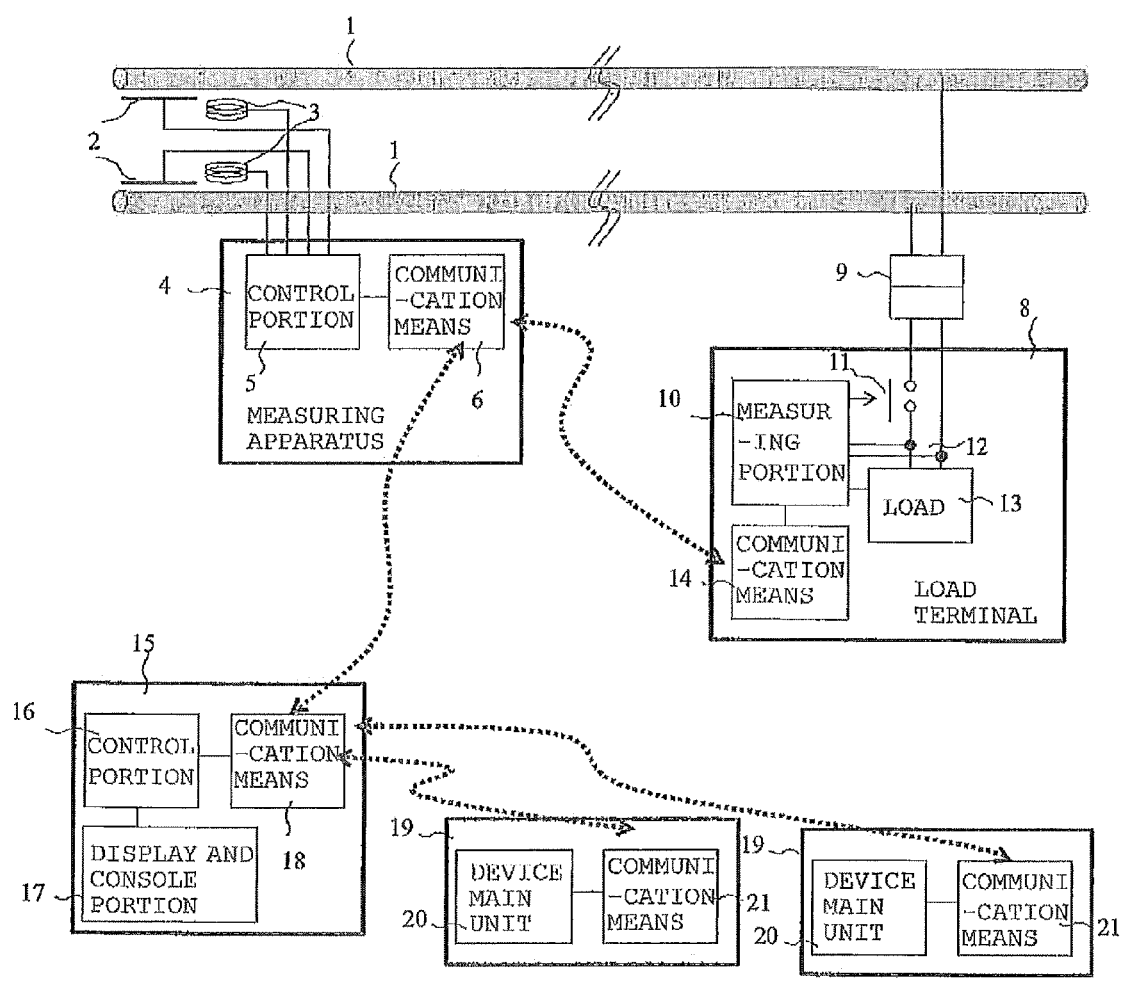
FIG. 6 illustrates the configuration of a device control system according to EXAMPLE 6 of the present invention.

FIG. 6 illustrates the configuration of a device control system according to EXAMPLE 6 of the present invention. In FIG. 6, reference numeral 1 denotes a power line for supplying power to an electric device, 2 denotes a voltage sensor for observing a voltage waveform between two power lines 2 through electrostatic coupling, and 3 denotes a current sensor for observing, through electromagnetic coupling, a magnetic flux generated by a current that flows through each power line 1 due to a load including the electric device, etc., and for observing a current waveform. In the case of a general home, the voltage sensor 2 and the current sensor 3 are installed, for example, near an indoor-side wiring connection point in a main breaker of a distribution board. Reference numeral 4 denotes a measuring apparatus comprising a control portion 5 and communication means 6 for communicating with a load terminal 8 and other terminals. The voltage sensor 2 and the current sensor 3 are connected to the control portion 5, and the control portion 5 executes calculation of power. Reference numeral 8 denotes a load terminal that is connected to each power line 1 through a receptacle (socket) and a receptacle plug 9. The load terminal 8 comprises a measuring portion 10, a voltage measuring terminal 12, a load 13 such as a resistance having a predetermined value, contact means 11 for turning on/off (closing or opening) connection of the power line 1 to the load 13, and communication means 14 to perform communication with the measuring apparatus 4 and the other terminals.

Reference numeral 15 denotes a controller comprising a control portion 16, a display and console portion 17, and communication means 18. The controller 15 controls the state of an electric device 19 based on the measured power value obtained from the measuring apparatus 4, etc. The electric device 19 comprises a device main unit 20 and communication means 21 for communicating with the controller. The electric device 19 may be constructed in the form that the device main unit 20 and the communication means 21 are integrated with each other, or that the communication means 21 is connected to the device main unit 20 through an adapter, for example.

The operation of EXAMPLE 6 will be described below with reference to FIG. 6.

When installed, the measuring apparatus 4 initially transmits, to the load terminal 8 via the communication means 6, a command for closing (turning "on") the contact means 11 of the load terminal 8. Upon receiving the command for turning "on" the contact means 11 via the communication means 14, the measuring portion 10 of the load terminal closes the contact means 11 for connection of the load 13 to the power line 1, measures a value of a current flowing through the load 13, and stores the measured value in a built-in memory. Further, the measuring portion 10 measures a voltage value between both ends of the voltage measuring terminal 12 and stores the measured value in the built-in memory. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal B via the communication means 6, a command for opening (turning "off") the contact means 11. Upon receiving the command for turning "off" the contact means 11 via the communication means 14, the measuring portion 10 of the load terminal 8 opens the contact means 11. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a request for monitoring the current value and the voltage value, which have been measured in the above-described manners. Upon receiving the monitoring request via the communication means 14, the measuring portion 10 of the load terminal 8 transmits both the current value and the voltage value, which are stored in the built-in memory, to the measuring apparatus 4 via the communication means 14. The control portion 5 of the measuring apparatus 4 receives the current value and the voltage value from the load terminal 8 via the communication means 6, and further calculates a power value Ps in the "closed" state from both the voltage waveform and the current waveform, which have been acquired when the contact means 11 is "closed".

Next, the control portion 5 of the measuring apparatus 4 calculate a power value Po in the "open" state from both the voltage waveform and the current waveform, which have been acquired when the contact means 11 is "opened". Further, the control portion 5 subtracts Po from Ps to calculate a power value Pd that is substantially proportional to power consumed by the load terminal 8. The control portion 5 of the measuring apparatus 4 repeats the process of closing and opening the contact means 11 of the load terminal 8, acquiring the voltage waveform, and acquiring the current waveform several times, thus calculating a mean value of several power values Pd. On that occasion, the power consumed by the load terminal 8 is obtained, as a power value Pdm measured by the measuring apparatus 4 by using the voltage sensor 2 and the current sensor 3, after reducing a change attributable to power consumed by other electric devices than the load terminal 8 through the steps of, for example, excluding one or more among the power values resulting from several repeated measurements, which differ from the mean value to a large extent, and taking a mean value of the remaining data Next, the control portion 5 calculates a power value Pr consumed by the load terminal 8 from the current value and the voltage value, which have been obtained from the load terminal 8. Further, the control portion 5 calculates a correction coefficient α based on the following formula (1) and determines the correction coefficient to be α, which is used when the measuring apparatus 4 calculates power.

$$Pr = \alpha \times Pdm$$

$$\therefore \alpha = Pr/Pdm \qquad (1)$$

The foregoing is the operation executed in the initial stage of the installation. The operation in measuring power will be described below.

The measuring apparatus 4 starts the power measurement after the correction coefficient α has been determined. In the power measurement, power consumed by the power line 1 is calculated by multiplying the result of multiplication between the voltage waveform observed with the voltage sensor 2 and the current waveform observed with the current sensor 3 by the correction coefficient α.

The controller 15 receives the measured power value from the measuring apparatus 4 via the communication means 18 at predetermined time intervals. Also, the controller 15 receives the operation status of the electric device 19 from the electric device 19 via the communication means 18 at predetermined time intervals. Further, when the operating state of the electric device 19 is changed with, e.g., an input operation made on the device main unit 20, the device main unit 20 of the electric device 19 transmits a notice indicating the change of the state to the controller 15 via the communication means 21. Thus, the controller 15 holds the consumed electric energy and the operating status of the electric device 19. In the controller 15, there are set an upper limit value of power and priority for each electric device 19 with input operations made on the display and console portion 17. For example, if the power value acquired from the measuring apparatus 4 exceeds the set upper limit value of electric energy, the control portion 16 of the controller 15 transmits, based on the priority set for each electric device 19, a control signal to one of the electric devices 19 via the communication means 18 for restricting a value of power or current for operating the main unit of the one electric device 19 having the lowest priority so that the measured power value is kept at or below the upper limit value of power.

Further, when another electric device 19 is going to start the operation while one electric device 19 is in the operation state, the other electric device 19 transmits information indicating the start of the operation to the controller 15. At that time, the controller 15 estimates a power value in the case where the other electric device 19 would come into the operation, based on the measured power value and the power consumed by the electric device 19 going to start the operation, the latter being registered in advance or obtained from preset operation information. For example, if the estimated power value exceeds the contract demand, the controller 15 transmits a command to the relevant electric device 19 via the communication means 18 to disallow the operation or restrict a value of power for operating the electric device 19 that is going to start the operation, or to stop the operation or restrict a value of power for operating the electric device 19 that is already in the operation state. As a result, the total power value is controlled to be held at a predetermined value or below.

Thus, the device control system of EXAMPLE 6 controls the electric devices such that the power value will not exceed a certain level.

As described above, the power can be measured just by connecting the load terminal 8 to the receptacle or the like, arranging the measuring apparatus 4 near a basic line, and arranging the voltage sensor 2 and the current sensor 3, which are each of the noncontact type, near the power line 1. In addition, a system for controlling the electric devices to be operated within a predetermined range of power value based on the measured power values can be constructed with no need of any work by professionals skilled in the art.

Although materials used for the voltage sensor 2 are not mentioned above, a film containing a sheet-like metallic material, a metallic split ring, a metallic clip, a conductive sheet, etc. can be used. Also, generally used current sensors including an air-core coil, a coil surrounded around a split core, a film coil manufactured by using a film substrate or the like, a magneto-electric transducer for converting a magnetic flux to an electric signal, such as a Hall device, etc. can be utilized as the current sensor 3.

Further, although a communication technique used in the communicating portion is not particularly designated, the communication technique can be practiced, for example, by using a power-line carrier communication technique, a wireless communication technique, and a wired communication technique using paired lines, etc. In the case of a visually reachable range, the function and advantages similar to those described above can also be obtained by using, e.g., an infrared communication technique.

In this EXAMPLE 6, the power line 1 is described as a two-wire line. In the case of a single-phase three-wire line, as another example, the power measurement can be performed in a similar manner by arranging the voltage sensor between each phase and a neutral line, arranging the current sensor for each phase, connecting one load terminal to a receptacle for each phase, and determining the correction coefficient for each phase. Further, the operation control system for the electric devices can be constructed in a similar manner by performing the power measurement with such an arrangement.

EXAMPLE 7

Figure 7:
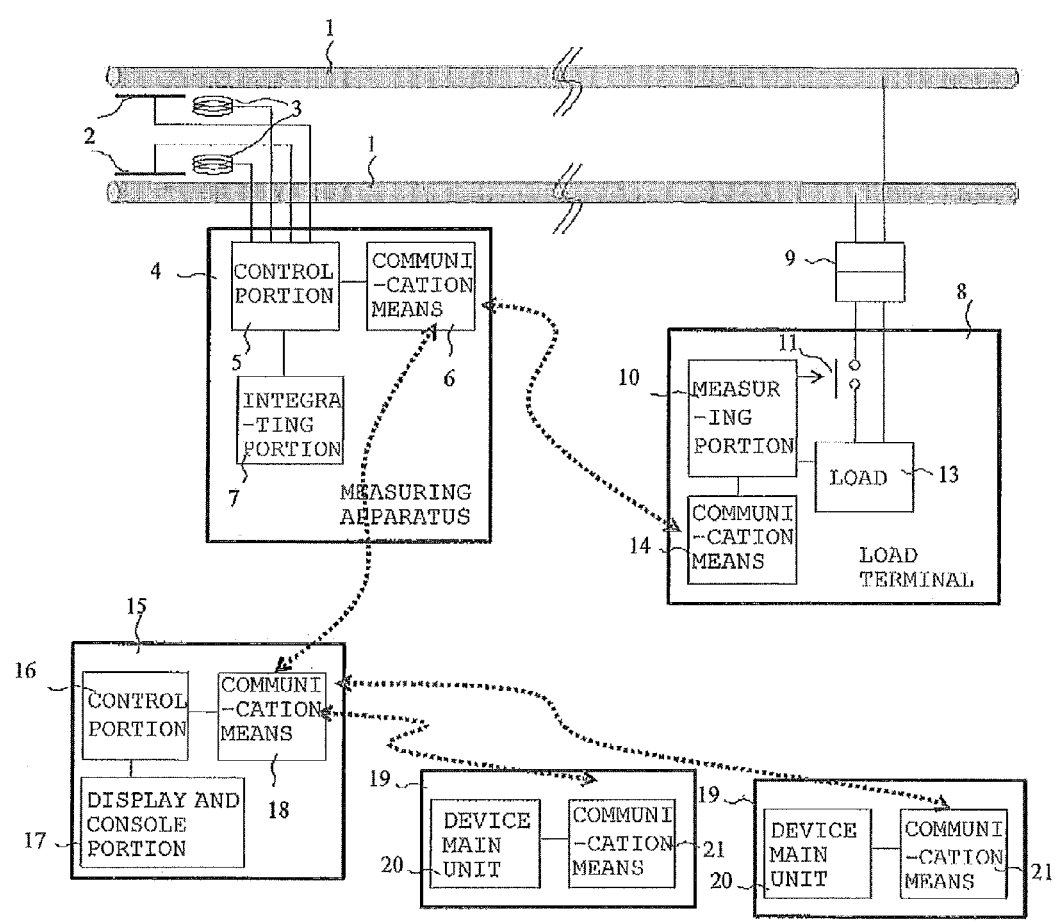
FIG. 7 illustrates the configuration of a device control system according to EXAMPLE 7 of the present invention.

FIG. 7 illustrates the configuration of a device control system according to EXAMPLE 7 of the present invention. In FIG. 3, reference numeral 1 denotes a power line for supplying power to an electric device, 2 denotes a voltage sensor for observing a voltage waveform between two power lines 2 through electrostatic coupling, and 3 denotes a current sensor for observing, through electromagnetic coupling, a magnetic flux generated by a current that flows through each power line 1 due to a load including the electric device, etc., and for observing a current waveform. In the case of a general home, the voltage sensor 2 and the current sensor 3 are installed, for example, near an indoor-side wiring connection point in a main breaker of a distribution board. Reference numeral 4 denotes a measuring apparatus comprising a control portion 5 and communication means 6 for communicating with a load terminal 8 and other terminals. The voltage sensor 2 and the current sensor 3 are connected to the control portion 5, and the control portion 5 executes calculation of power. Reference numeral 7 denotes an integrating portion for integrating the measured power value for a predetermined time to obtain electric energy (i.e., an accumulative amount of power). Reference numeral 8 denotes a load terminal that is connected to each power line 1 through a receptacle (socket) and a receptacle plug 9. The load terminal 8 comprises a measuring portion 10, a load 13 such as a resistance having a predetermined value, contact means 11 for turning on/off (closing or opening) connection of the power line 1 to the load 13, and communication means 14 to perform communication with the measuring apparatus 4.

Reference numeral 15 denotes a controller comprising a control portion 16, a display and console portion 17, and communication means 18. The controller 15 controls the state of an electric device 19 based on the measured power value obtained from the measuring apparatus 4, etc. The electric device 19 comprises a device main unit 20 and communication means 21 for communicating with the controller. The electric device 19 may be constructed in the form that the device main unit 20 and the communication means 21 are integrated with each other, or that the communication means 21 is connected to the device main unit 20 through an adapter, for example.

The operation of EXAMPLE 7 will be described below with reference to FIG. 7.

When installed, the measuring apparatus 4 initially transmits, to the load terminal 8 via the communication means 6, a command for closing (turning "on") the contact means 11 of the load terminal 8. Upon receiving the command for turning "on" the contact means 11 via the communication means 14, the measuring portion 10 of the load terminal closes the contact means 11 for connection of the load 13 to the power line 1, measures a value of a current flowing through the load 13, and stores the measured value in a built-in memory. Further, the measuring portion 10 multiplies the measured current value by the impedance of the load 13 to calculate a voltage value and stores the calculated value in the built-in memory. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a command for opening (turning "off") the contact means 11. Upon receiving the command for turning "off" the contact means 11 via the communication means 14, the measuring portion 10 of the load terminal 8 opens the contact means 11. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a request for monitoring the current value and the voltage value, which have been measured and calculated in the above-described manners. Upon receiving the monitoring request via the communication means 14, the measuring portion 10 of the load terminal 8 transmits both the current value and the voltage value, which are stored in the built-in memory, to the measuring apparatus 4 via the communication means 14. The control portion 5 of the measuring apparatus 4 receives the current value and the voltage value from the load terminal 8 via the communication means 6, and further calculates a power value Ps in the "closed" state from both the voltage waveform and the current waveform, which have been acquired when the contact means 11 is "closed".

Next, the control portion 5 of the measuring apparatus 4 calculate a power value Po in the "open" state from both the voltage waveform and the current waveform, which have been acquired when the contact means 11 is "opened". Further, the control portion 5 subtracts Po from Ps to calculate a power value Pd that is substantially proportional to power consumed by the load terminal 8. The control portion 5 of the measuring apparatus 4 repeats the process of closing and opening the contact means 11 of the load terminal 8, acquiring the voltage waveform, and acquiring the current waveform several times, thus calculating a mean value of several power values Pd. On that occasion, the power consumed by the load terminal 8 is obtained, as a power value Pdm measured by the measuring apparatus 4 by using the voltage sensor 2 and the current sensor 3, after reducing a change attributable to power consumed by other electric devices than the load terminal 8 through the steps of, for example, excluding one or more among the power values resulting from several repeated measurements, which differ from the mean value to a large extent, and taking a mean value of the remaining data.

Next, the control portion 5 calculates a power value Pr consumed by the load terminal 8 from the current value and the voltage value, which have been obtained from the load terminal 8. Further, the control portion 5 calculates a correction coefficient α based on the following formula (1) and determines the correction coefficient to be α, which is used when the measuring apparatus 4 calculates power.

$$Pr = \alpha \times Pdm$$

$$\therefore \alpha = Pr/Pdm \tag{1}$$

The foregoing is the operation executed in the initial stage of the installation. The operation in measuring power will be described below.

The measuring apparatus 4 starts the power measurement after the correction coefficient α has been determined. In the power measurement, power consumed by the power line 1 is calculated by multiplying the result of multiplication between the voltage waveform observed with the voltage sensor 2 and the current waveform observed with the current sensor 3 by the correction coefficient α.

Next, the control portion 5 inputs a calculated value of the power consumed by the power line 1 to the integrating portion 7. The integrating portion 7 accumulates the input power value for the predetermined time to obtain electric energy.

The controller 15 receives the measured electric energy value from the measuring apparatus 4 via the communication means 18 at a predetermined time interval. Also, the controller 15 receives the operation status of the electric device 19 from the electric device 19 via the communication means 18 at a predetermined time interval. Further, when the operating state of the electric device 19 is changed by, e.g., an operation made on the device main unit 20, the device main unit 20 of the electric device 19 transmits a notice indicating the change of the state to the controller 15 via the communication means 21. Thus, the controller 15 holds the consumed electric energy and the operating status of the electric device 19. In the controller 15, there are set an upper limit value of electric energy and priority for each electric device 19 through operations made on the display and console portion 17. For example, if the electric energy acquired from the measuring apparatus 4 exceeds the set upper limit value of electric energy, the control portion 16 of the controller 15 transmits, based on the priority set for each electric device 19, a control signal to one of the electric devices 19 via the communication means 18 for restricting a value of power or current for operating the main unit of the one electric device 19 having a lower priority so that the measured electric energy value is kept at or below the upper limit value of electric energy.

Further, when another electric device 19 is going to start the operation while one electric device 19 is in the operation state, the other electric device 19 transmits information indicating the start of the operation to the controller 15. At that time, the controller 15 estimates total electric energy in the case where the other electric device 19 would come into the operation, based on the measured electric energy value and the electric energy consumed by the electric device 19 going to start the operation, the latter being registered in advance or obtained from preset operation information. For example, if the estimated electric energy value exceeds the contract demand, the controller 15 transmits a command to the relevant electric device 19 via the communication means 18 to disallow the operation or restrict a value of power for operating the electric device 19 that is going to start the operation, or to stop the operation or restrict a value of power for operating the electric device 19 that is already in the operation state. As a result, the total power value is controlled to be held at a predetermined value or below.

Thus, the device control system of EXAMPLE 7 controls the electric devices such that the electric energy value will not exceed a certain level.

As described above, the electric energy can be measured just by connecting the load terminal 8 to the receptacle or the like, arranging the measuring apparatus 4 near a basic line, and arranging the voltage sensor 2 and the current sensor 3, which are each of the noncontact type, near the power line 1. In addition, a system for controlling the electric devices to be operated within a predetermined range of electric energy based on the measured electric energy can be constructed with no need of any work by professionals skilled in the art.

Although materials used for the voltage sensor 2 are not mentioned above, a film containing a sheet-like metallic material, a metallic split ring, a metallic clip, a conductive sheet, etc. can be used. Also, generally used current sensors including an air-core coil, a coil surrounded around a split core, a film coil manufactured by using a film substrate or the like, a magneto-electric transducer for converting a magnetic flux to an electric signal, such as a Hall device, etc. can be utilized as the current sensor 3.

Further, although a communication technique used in the communicating portion is not particularly designated, the communication technique can be practiced, for example, by using a power-line carrier communication technique, a wireless communication technique, and a wired communication technique using paired lines, etc. In the case of a visually reachable range, the function and advantages similar to those described above can also be obtained by using, e.g., an infrared communication technique.

In this EXAMPLE 7, the power line 1 is described as a two-wire line. In the case of a single-phase three-wire line, as another example, the electric energy measurement can be performed in a similar manner by arranging the voltage sensor between each phase and a neutral line, arranging the current sensor for each phase, connecting one load terminal to a receptacle for each phase, and determining the correction coefficient for each phase. Further, the operation control system for the electric devices can be constructed in a similar manner by performing the electric energy measurement with such an arrangement.

EXAMPLE 8

Figure 8:
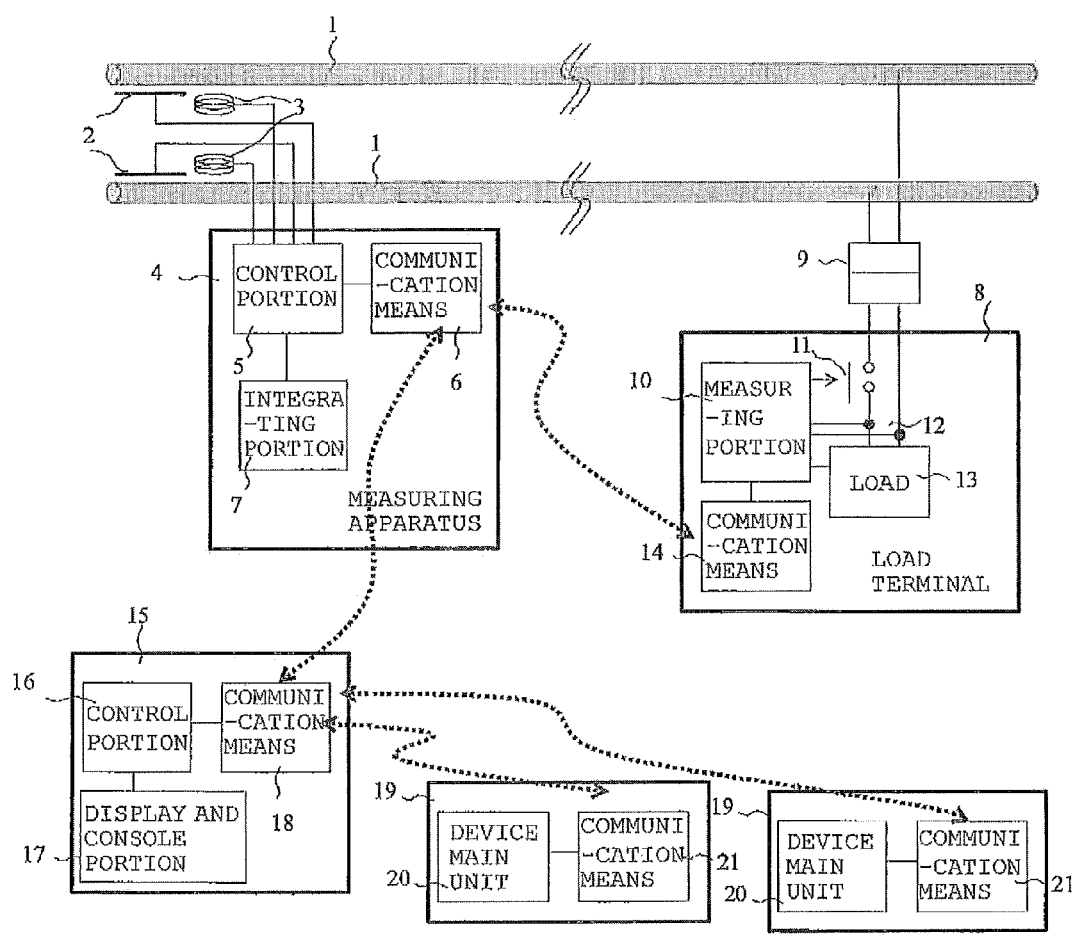
FIG. 8 illustrates the configuration of a device control system according to EXAMPLE 8 of the present invention.

FIG. 8 illustrates the configuration of a device control system according to EXAMPLE 8 of the present invention. In FIG. 8, reference numeral 1 denotes a power line for supplying power to an electric device, 2 denotes a voltage sensor for observing a voltage waveform between two power lines 2 through electrostatic coupling, and 3 denotes a current sensor for observing, through electromagnetic coupling, a magnetic flux generated by a current that flows through each power line 1 due to a load including the electric device, etc., and for observing a current waveform. In the case of a general home, the voltage sensor 2 and the current sensor 3 are installed, for example, near an indoor-side wiring connection point in a main breaker of a distribution board. Reference numeral 4 denotes a measuring apparatus comprising a control portion 5 and communication means 6 for communicating with a load terminal 8 and other terminals. The voltage sensor 2 and the current sensor 3 are connected to the control portion 5, and the control portion 5 executes calculation of power. Reference numeral 7 denotes an integrating portion for integrating the measured power value for a predetermined time to obtain electric energy (i.e., an accumulative amount of power). Reference numeral 8 denotes a load terminal that is connected to each power line 1 through a receptacle (socket) and a receptacle plug 9. The load terminal 8 comprises a measuring portion 10, a voltage measuring terminal 12, a load 13 such as a resistance having a predetermined value, contact means 11 for turning on/off (closing or opening) connection of the power line 1 to the load 13, and communication means 14 to perform communication with the measuring apparatus 4.

Reference numeral 15 denotes a controller comprising a control portion 16, a display and console portion 17, and communication means 18. The controller 15 controls the state of an electric device 19 based on the measured power value obtained from the measuring apparatus 4, etc. The electric device 19 comprises a device main unit 20 and communication means 21 for communicating with the controller. The electric device 19 may be constructed in the form that the device main unit 20 and the communication means 21 are integral with each other, or that the communication means 21 is connected to the device main unit 20 through an adapter, for example.

The operation of EXAMPLE 8 will be described below with reference to FIG. 8.

When installed, the measuring apparatus 4 initially transmits, to the load terminal 8 via the communication means 6, a command for closing (turning "on") the contact means 11 of the load terminal 8. Upon receiving the command for turning "on" the contact means 11 via the communication means 14, the measuring portion 10 of the load terminal closes the contact means 11 for connection of the load 13 to the power line 1, measures a value of a current flowing through the load 13, and stores the measured value in a built-in memory. Further, the measuring portion 10 measures a voltage value across both ends of the voltage measuring terminal 12 and stores the measured value in the built-in memory. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a command for opening (turning "off") the contact means 11. Upon receiving the command for turning "off" the contact means 11 via the communication means 14, the measuring portion 10 of the load terminal 8 opens the contact means 11. On the other hand, the control portion 5 of the measuring apparatus 4 acquires a voltage waveform at that time for a predetermined period, e.g., a period corresponding to several cycles of commercial frequency, by using the voltage sensor 2. Simultaneously, the control portion 5 acquires a current waveform for a predetermined period, e.g., a period corresponding to several cycles of commercial frequency, by using the current sensor 3.

Next, the control portion 5 of the measuring apparatus 4 transmits, to the load terminal 8 via the communication means 6, a request for monitoring the current value and the voltage value, which have been measured in the above-described manners. Upon receiving the monitoring request via the communication means 14, the measuring portion 10 of the load terminal 8 transmits both the current value and the voltage value, which are stored in the built-in memory, to the measuring apparatus 4 via the communication means 14. The control portion 5 of the measuring apparatus 4 receives the current value and the voltage value from the load terminal 8 via the communication means 6, and further calculates a power value Ps in the "closed" state from both the voltage waveform and the current waveform, which have been acquired when the contact means 11 is "closed".

Next, the control portion 5 of the measuring apparatus 4 calculate a power value Po in the "open" state from both the voltage waveform and the current waveform, which have been acquired when the contact means 11 is "opened". Further, the control portion 5 subtracts Po from Ps to calculate a power value Pd that is substantially proportional to power consumed by the load terminal 8. The control portion 5 of the measuring apparatus 4 repeats the process of closing and opening the contact means 11 of the load terminal 8, acquiring the voltage waveform, and acquiring the current waveform several times, thus calculating a mean value of several power values Pd. On that occasion, the power consumed by the load terminal 8 is obtained, as a power value Pdm measured by the measuring apparatus 4 by using the voltage sensor 2 and the current sensor 3, after reducing a change attributable to power consumed by other electric devices than the load terminal 8 through the steps of, for example, excluding one or more among the power values resulting from several repeated measurements, which differ from the mean value to a large extent, and taking a mean value of the remaining data.

Next, the control portion 5 calculates a power value Pr consumed by the load terminal 8 from the current value and the voltage value, which have been obtained from the load terminal 8. Further, the control portion 5 calculates a correction coefficient a based on the following formula (1) and determines the correction coefficient to be α, which is used when the measuring apparatus 4 calculates power.

$$Pr = \alpha \times Pdm$$

$$\therefore \alpha = Pr/Pdm \qquad (1)$$

The foregoing is the operation executed in the initial stage of the installation. The operation in measuring power will be described below.

The measuring apparatus 4 starts the power measurement after the correction coefficient α has been determined. In the power measurement, power consumed by the power line 1 is calculated by multiplying the result of multiplication between the voltage waveform observed with the voltage sensor 2 and the current waveform observed with the current sensor 3 by the correction coefficient α.

Nest, the control portion 5 inputs a calculated value of the power consumed by the power line 1 to the integrating portion 7. The integrating portion 7 accumulates the input power value for the predetermined time to obtain electric energy.

The controller 15 receives the measured electric energy value from the measuring apparatus 4 via the communication means 18 at predetermined time intervals. Also, the controller 15 receives the operation status of the electric device 19 from the electric device 19 via the communication means 18 at predetermined time intervals. Further, when the operating state of the electric device 19 is changed with, e.g., an input operation made on the device main unit 20, the device main unit 20 of the electric device 19 transmits a notice indicating the change of the state to the controller 15 via the communication means 21. Thus, the controller 15 holds the consumed electric energy and the operating status of the electric device 19. In the controller 15, there are set an upper limit value of electric energy and priority for each electric device 19 with input operations made on the display and console portion 17. For example, if the electric energy acquired from the measuring apparatus 4 exceeds the set upper limit value of electric energy, the control portion 16 of the controller 15 transmits, based on the priority set for each electric device 19, a control signal to one of the electric devices 19 via the communication means 18 for restricting a value of power or current for operating the main unit of the one electric device 19 having the lowest priority so that the measured electric energy value is kept at or below the upper limit value of electric energy.

Further, when another electric device 19 is going to start the operation while one electric device 19 is in the operation state, the other electric device 19 transmits information indicating the start of the operation to the controller 15. At that time, the controller 15 estimates total electric energy in the case where the other electric device 19 would come into the operation, based on the measured electric energy value and the electric energy consumed by the electric device 19 going to start the operation, the latter being registered in advance or obtained from preset operation information. For example, if the estimated electric energy value exceeds the contract demand, the controller 15 transmits a command to the relevant electric device 19 via the communication means 18 to disallow the operation or restrict a value of power for operating the electric device 19 that is going to start the operation, or to stop the operation or restrict a value of power for operating the electric device 19 that is already in the operation state. As a result, the total power value is controlled to be held at a predetermined value or below.

Thus, the device control system of EXAMPLE 8 controls the electric devices such that the power value will not exceed a certain level.

As described above, the electric energy can be measured just by connecting the load terminal 8 to the receptacle or the like, arranging the measuring apparatus 4 near a backbone line, and arranging the voltage sensor 2 and the current sensor 3, which are the noncontact type, near the power line 1. In addition, a system for controlling the electric devices to be operated within a predetermined range of electric energy based on the measured electric energy can be constructed with no need of any work by professionals skilled in the art.

Although materials used for the voltage sensor 2 are not mentioned above, a film containing a sheet-like metallic material, a metallic split ring, a metallic clip, a conductive sheet, etc. can be used. Also, generally used current sensors including an air-core coil, a coil surrounded around a split core, a film coil manufactured by using a film substrate or the like, a magneto-electric transducer for converting a magnetic flux to an electric signal, such as a Hall device, etc. can be utilized as the current sensor 3.

Further, although a communication technique used in the communicating portion is not particularly designated, the communication technique can be practiced, for example, by using a power-line carrier communication technique, a wireless communication technique, and a wired communication technique using paired lines, etc. In the case of a visually reachable range, the function and advantages similar to those described above can also be obtained by using, e.g., an infrared communication technique.

In this EXAMPLE 8, the power line 1 is described as a two-wire line. In the case of a single-phase three-wire line, as another example, the electric energy measurement can be performed in a similar manner by arranging the voltage sensor between each phase and a neutral line, arranging the current sensor for each phase, connecting one load terminal to a receptacle for each phase, and determining the correction coefficient for each phase. Further, the operation control system for the electric devices can be constructed in a similar manner by performing the electric energy measurement with such an arrangement.

Details of the load terminal 8 will be described below.

EXAMPLE 9

Figure 9:
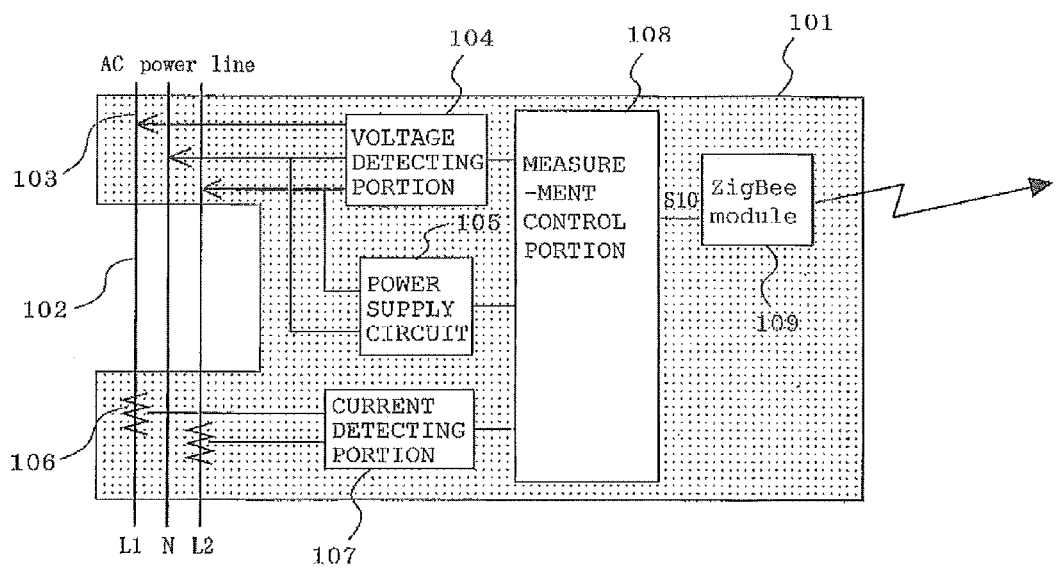
FIG. 9 illustrates an exemplary construction of a power measuring apparatus according to each of EXAMPLES 9, 11 and 12 of the present invention.

FIG. 9 illustrates the construction of a power measuring apparatus 101 according to EXAMPLE 9 of the present invention. The power measuring apparatus 101 corresponds to one of the load terminals 8 illustrated in FIGS. 1 to 8. In FIG. 9, the receptacle 9 and the contact means 11 illustrated in FIGS. 1 to 8 are omitted. In FIG. 9, the power measuring apparatus 101 comprises a voltage detecting portion 104 for generating a signal corresponding to a voltage, which is applied to a single-phase three-wired electric path 102, through a conductive electric-path contact 103, a power supply circuit 105 similarly connected to the electric path 102 through the conductive electric-path contact 103 and producing a source power necessary for operating the power measuring apparatus 101, current transformers 106 each made up of a magnetic substance core having an open magnetic path and a coil wound around the magnetic substance core, the current transformers 106 being arranged respectively for lines L1 and L2 of the single-phase three-line electric path 102 except for its neutral line N, a current detecting portion 107 for measuring current signals obtained from the current transformers 106, a measurement control portion 108 constituted by, e.g., a microcomputer and calculating a power value based on a voltage waveform signal proportional to the voltage of the electric path, which is obtained from the voltage detecting portion 104, and a current signal proportional to a value of a current flowing through the electric path 102, which is obtained from the current detecting portion 107, and a wireless communication means 109 for transmitting the power value measured by the measurement control portion 108, etc. to the exterior.

While the wireless communication means 109 is constituted by a ZigBee Module in the example of FIG. 9, the wireless communication means is not limited to a particular one. As other examples, infrared communication and wireless LAN are also usable. Further, while the measurement control portion 108 and the wireless communication means 109 are connected to each other by a serial input/output (SIO) line, the connection method is not limited to a particular one and parallel transmission using a plurality of lines can also be employed.

Be it noted that a combination of the measurement control portion 108, the voltage detecting portion 104, and the current detecting portion 107 corresponds to a combination of the control portion 10 and the resistance 13 in the load terminal 8 illustrated in FIGS. 1 to 8, and the wireless communication means 109 corresponds to the communication means 14 in the load terminal 8 illustrated in FIGS. 1 to 8.

Figure 10:
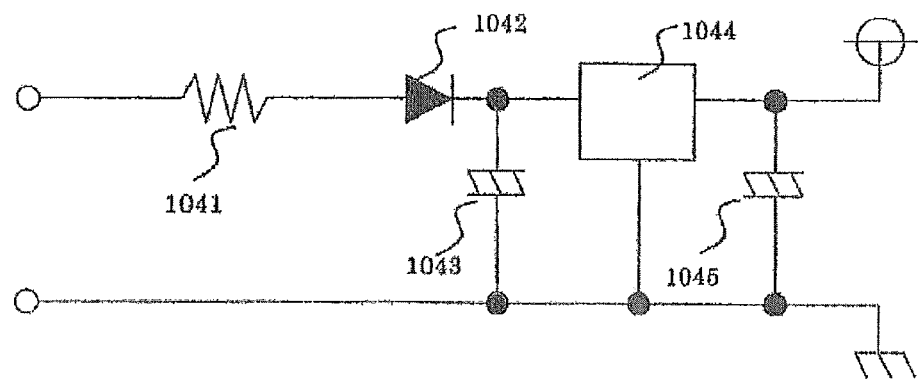
FIG. 10 is a power supply circuit diagram of the power measuring apparatus according to each of EXAMPLES 9 to 12 of the present invention.

FIG. 10 illustrates a detailed circuit arrangement of the power supply circuit 105. In FIG. 10, reference numeral 1041 denotes a resistance, 1042 denotes a rectifying diode, 1043 denotes a smoothing capacitor, 1044 denotes a power supply regulator for stabilizing a pulsatory voltage after the smoothing to a predetermined DC voltage, and 1045 denotes a capacitor for absorbing fluctuations of a load current. The power supply circuit 105 is connected to the electric path 102 in a non-isolated manner through the electric path contact 103, which is held in contact with the electric path 102, without using any isolation means such as an AC transformer.

Be it noted that the power supply circuit 105 constitutes a power supply portion, the measurement control portion 108 constitutes a computing portion, the communication means 109 constitutes a communicating portion, and a current limiting portion 1010 constitutes an electric breaker.

Figure 11:
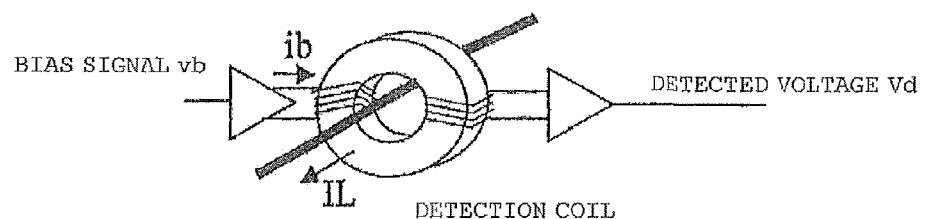
FIG. 11 illustrates an exemplary construction of a current detecting portion in each of EXAMPLES 9 to 12 of the present invention.
Figure 12:
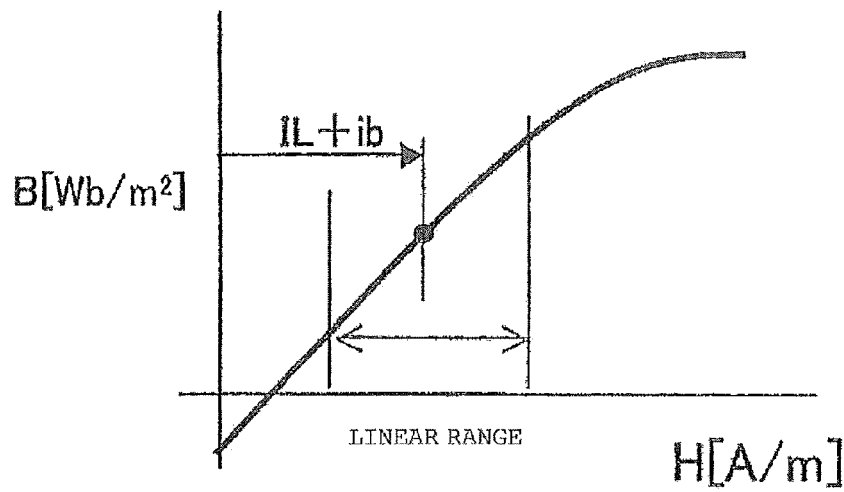
FIG. 12 is a graph illustrating an exemplary characteristic of the current detecting portion in each of EXAMPLES 9 to 12 of the present invention.
Figure 13:
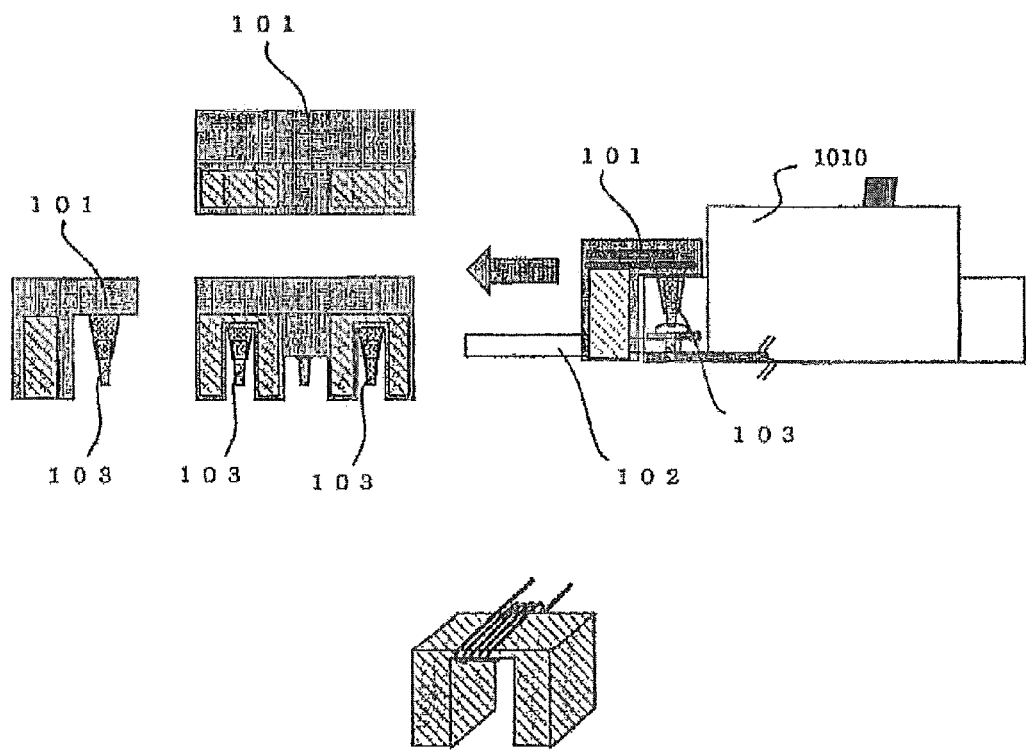
FIG. 13 illustrates a core structure of the current detecting portion in each of EXAMPLES 9, 11 and 12 of the present invention.

FIG. 11 illustrates the principle of the current transformer 106. While the illustration of FIG. 11 represents a ring-shaped core having a closed magnetic path for the sake of explanation, the core actually used in EXAMPLE 9 has an open magnetic path as illustrated in FIG. 13. The current transformer 106 is constituted by a core around which are wound a detection coil for obtaining a voltage value that is proportional to a current IL flowing through each line of the current path 102, and a bias coil for supplying a predetermined bias current ib. A predetermined magnetic flux is applied to the core to such an extent that the current transformer 106 can maintain its operating point within a region where, as illustrated in FIG. 12, a magnetic field generated by the current and a magnetic density inside the core are linear with respect to a change of the current IL.

FIG. 13 illustrates a structure of the current transformer 106 formed in an open magnetic path and an appearance of the power measuring apparatus 101. The power measuring apparatus 101 is installed by being fitted to a terminal portion of a current limiter 1010. The current transformer 106 is structured such that its core sandwiches each of the lines L1 and L2 except for a connection terminal of the neutral line N. Each electric path contact 103 has a structure capable of expanding and contracting so as to contact with each of respective terminals of L1, N and L2.

Figure 14:
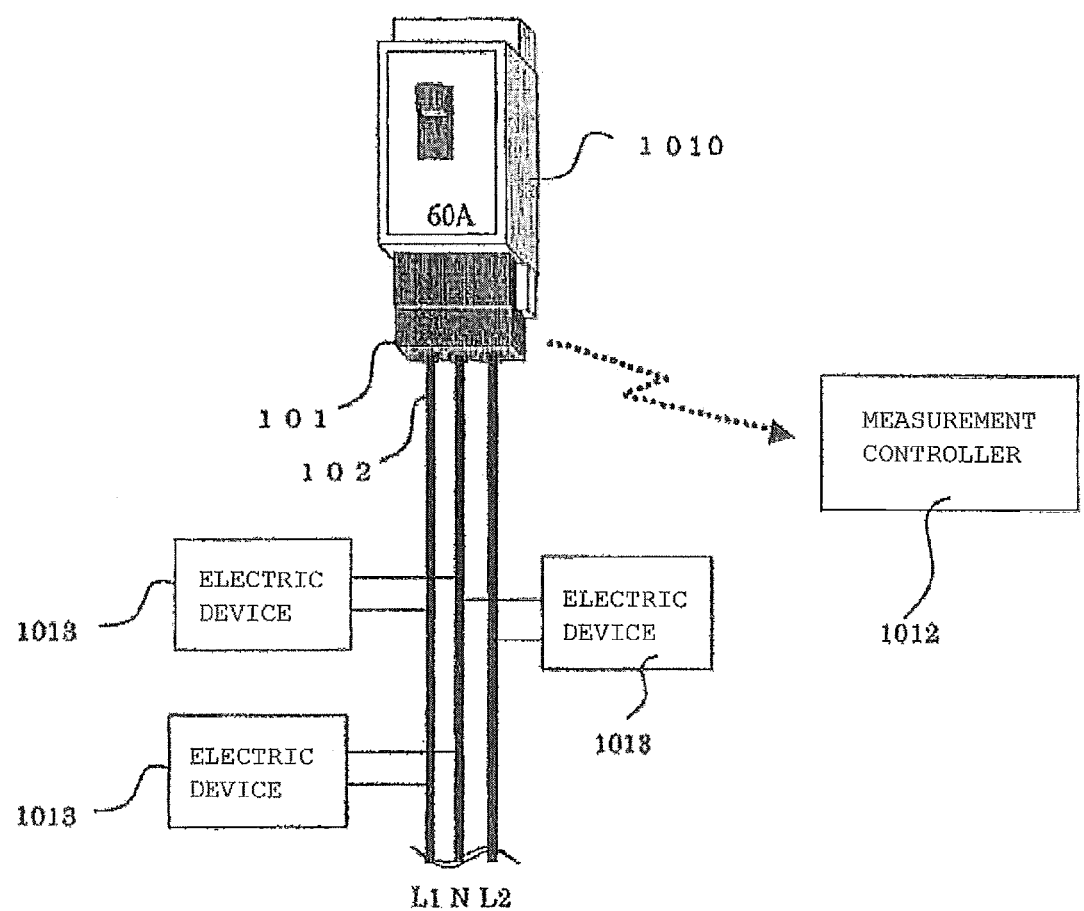
FIG. 14 illustrates an exemplary configuration of a measuring system including the power measuring apparatus according to each of EXAMPLES 9, 11 and 12 of the present invention.

As illustrated in FIG. 14, the power measuring apparatus 101 having the above-described construction is arranged at the terminal portion of the current limiter 1010 and measures power consumed by electric devices 1013 connected to an L1-N phase and an L2-N phase of the electric path 102. Each measured value is transmitted, via the wireless communication means 109, to a measurement controller 1012 (constituting an I/F means), which also has wireless communication means and which performs power measurement. When the power measuring apparatus 101 is mounted to the current limiter 1010, the power measuring apparatus 101 is connected to the L1-N phase and the L2-N phase of the electric path 102 through the electric path contacts 103, and respective AC voltages of the commercial frequency are input to the power supply circuit 105. In the power supply circuit 105, the input AC voltages are each reduced to a predetermined level by the resistor 1041 in FIG. 10, half-wave rectified by the diode 1042, and is smoothed by the smoothing capacitor 1043 for conversion to a DC voltage including a predetermined ripple. The converted DC voltage is then input to the voltage regulator 1044. The voltage regulator 1044 supplies various source powers to the voltage detecting portion 104, the current detecting portion 107, the measurement control portion 108, and the wireless communication means 109 for operating them. After automatic resetting upon, the supply of the source power, the measurement control portion 108 starts the power measurement. The start of the power measurement may be initiated by a command received from the measurement controller 1012 via the wireless communication means 109.

The operation of the power measurement will be described below. Respective voltages V1(t) and V2(t) in the L1-N phase and the L2-N phase of the electric path 102 are input to the measurement control portion 108 from the voltage detecting portion 104 after their amplitude values have been converted so as to fall within an input voltage range allowable for the relevant device, e.g., an amplitude range of 5 V or below when the source voltage is 5 V, for example. At the same time, the current transformers 106 each formed in the open magnetic path measure respective currents flowing through L1 and L2. The current detecting portion 107 adjusts the bias current ib such that an output level from each of the current transformers 106 falls within the linear range of the B-H curve illustrated in FIG. 12. For the L1 and L2 phases, voltage levels Vi1(t) and Vi2(t) obtained from the respective line currents IL and bias current values ib1(t) and ib2(t) are input to the measurement control portion 108. The measurement control portion 108 reads the thus-input V1(t) and V2(t), Vi1(t) and Vi2(t) proportional to the respective line currents, as well as ib1(t) and ib2(t) at predetermined time intervals through AD converters, for example.

The current value I1(t) in the L1 phase is given by subtracting ib1(t), which corresponds to the bias component, from Vi1(t), namely;

$$I1(t)=AVi1(t)-ib1(t)$$

where A is a constant for converting the voltage value obtained from the line current IL to a current.

Similarly, the current value I2(t) in the L2 phase is given by;

$$I2(t)=AVi2(t)-ib2(t)$$

where A is a constant for converting the voltage value obtained from the line current IL to a current.

Respective powers in the L1 phase and the L2 phase are calculated based on the following formulae from the current values I1(t) and I2(t) and the voltage values V1(t) and V2(t).

$$P1 = \frac{1}{T}\int V1(t) \times I1(t)dt \qquad \text{[Formulae 1]}$$
$$P2 = \frac{1}{T}\int V2(t) \times I2(t)dt$$

Thus-calculated power values P1 and P2 are transmitted to the measurement controller 1012 via the wireless communication means 109. Hence the measurement controller 1012 can measure the power values.

As described above, since the measured data is transmitted to the measurement controller via the wireless communication means 109, the power measuring apparatus 101 can be easily installed free from false wiring. Further, since the measurement controller (I/F means) is of the noncontact isolated structure, installation work can be safely performed free from electric shock, etc. In addition, since the power supply circuit 105 and the electric path are connected to each other in a non-isolated manner without using any isolation device, the power measuring apparatus 101 can be easily installed at a lower cost and the circuit scale can be reduced.

While in this EXAMPLE the power values are calculated in the measurement control portion, the measurement control portion may be constituted so as to calculate respective integral values of P1 and P2 such that the power measuring apparatus is modified to function as an electric energy meter. As an alternative, the power measuring apparatus 101 may be modified such that a calculation algorithm can be changed from the measurement controller 1012 and a command for changing the calculation algorithm is input to the measurement control portion 108 via the wireless communication means 109. With such a modification, the measurement control portion 108 can output various measured values by performing separate measurements of the voltage value and the current value, measurements of effective power and ineffective power, etc. with the same configuration.

While the current transformer 106 formed in the open magnetic path is used in EXAMPLE 9, the same operation and the same advantages can also be obtained by using a current transformer formed in a closed magnetic path.

The power measuring apparatus 101 comprises a first coil for transferring power and a data signal in an electromagnetic inductive wireless manner, a power converting portion for converting the power supplied through the first coil, and a communication control portion for controlling data communication to and from the measurement controller 1012 through the first coil. Communication means of the measurement controller 1012 comprises a second coil for transferring power and a data signal in an electromagnetic inductive wireless manner, a power receiving portion for receiving the power supplied from the power measuring apparatus 101 through the second coil, a communication control portion for controlling data communication to and from the power measuring apparatus through the second coil, and a communication I/F portion 1015.

EXAMPLE 10

Figure 15:
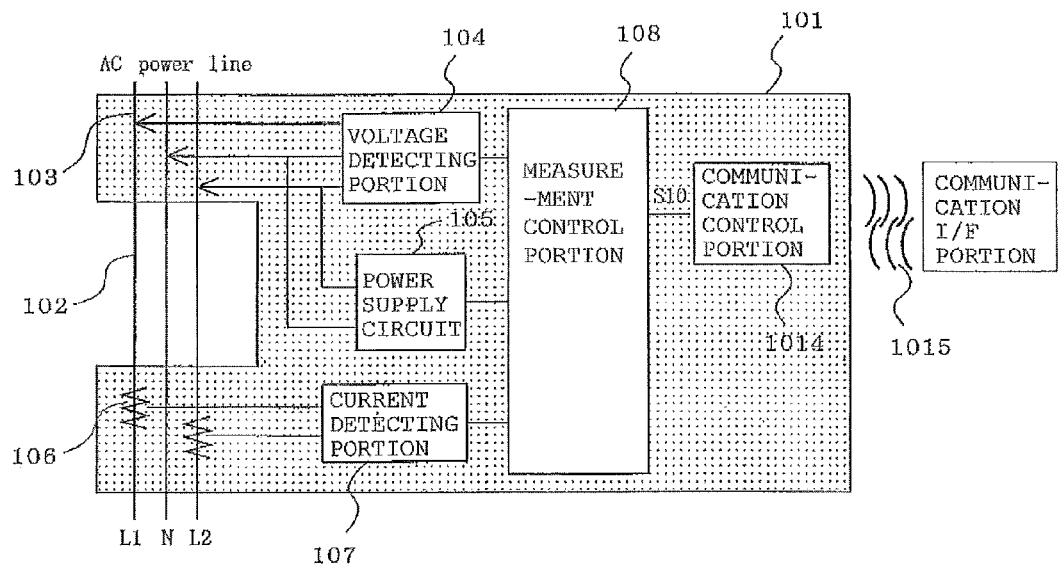
FIG. 15 illustrates an exemplary construction of the power measuring apparatus according to each of EXAMPLES 10, 11 and 12 of the present invention.

FIG. 15 illustrates the construction of a power measuring apparatus according to EXAMPLE 10 of the present invention. FIGS. 10 and 12 are also referred to in the following description of EXAMPLE 10. In FIG. 15, a power measuring apparatus 101 comprises a voltage detecting portion 104 for generating a signal corresponding to a voltage of a single-phase three-wired electric path 102, which is applied through a conductive electric-path contact 103, a power supply circuit 105 similarly connected to the electric path 102 through the conductive electric-path contact 103 and producing a source power necessary for operating the power measuring apparatus 101, current transformers 106 each made up of a magnetic substance core having a closed magnetic path and a coil wound around the magnetic substance core, the current transformers 106 being arranged respectively for lines L1 and L2 of the single-phase three-line electric path 102 except for its neutral line N, a current detecting portion 107 for measuring current signals obtained from the current transformers 106, a measurement control portion 108 constituted by, e.g., a microcomputer and calculating a power value based on a voltage waveform signal proportional to the voltage of the electric path, which is obtained from the voltage detecting portion 104, and a current signal proportional to a value of a current flowing through the electric path 102, which is obtained from the current detecting portion 107, and a communication control portion 1014 for transmitting the power value measured by the measurement control portion 108, etc. to the exterior. The communication control portion 1014 has the function of transferring a data signal in a two-way manner and supplying operation power to a communication I/F portion 1015, which includes one or plural I/F means selected from among LAN, RS232C, USB, an analog signal output, etc., by using a noncontact medium such as electromagnetic inductive radio waves or light.

Details of the power supply circuit 105 are the same as those described above in EXAMPLE 9 with reference to FIG. 10, and hence a description thereof is omitted. Further, the current transformer 106 has the same structure and is operated in the same manner as that in EXAMPLE 9 except for that the core forms the closed magnetic path, and hence a description thereof is also omitted.

Figure 16:
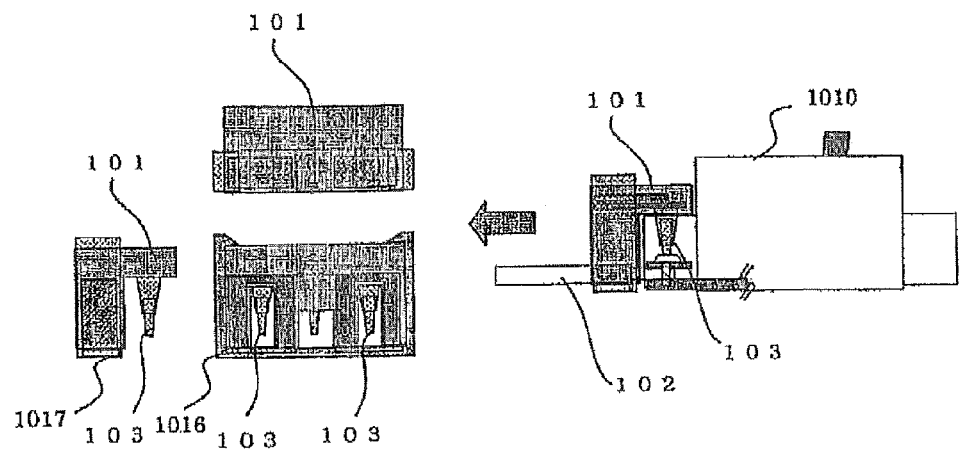
FIG. 16 illustrates an exemplary structure of a core of a current detecting portion in each of EXAMPLES 10, 11 and 12 of the present invention.

FIG. 16 illustrates a structure of the current transformer 106 formed in a closed magnetic path and an appearance of the power measuring apparatus 101. The power measuring apparatus 101 is installed by being fitted to a terminal portion of the current limiter 1010. The current transformer 106 is structured such that its core sandwiches each of the lines L1 and L2 except for a connection terminal of the neutral line N. A magnetic material 1017 similar to that of the core is arranged at the underside of a clamp 1016 adapted for fitting of the power measuring apparatus to the current limiter such that, when fitted, the closed magnetic path is formed by the core material of the current transformer 106 and the magnetic material 1017 under the clamp 1016. Each electric path contact 103 has a structure capable of expanding and contracting so as to contact with each of respective terminals of L1, N and L2.

Figure 17:
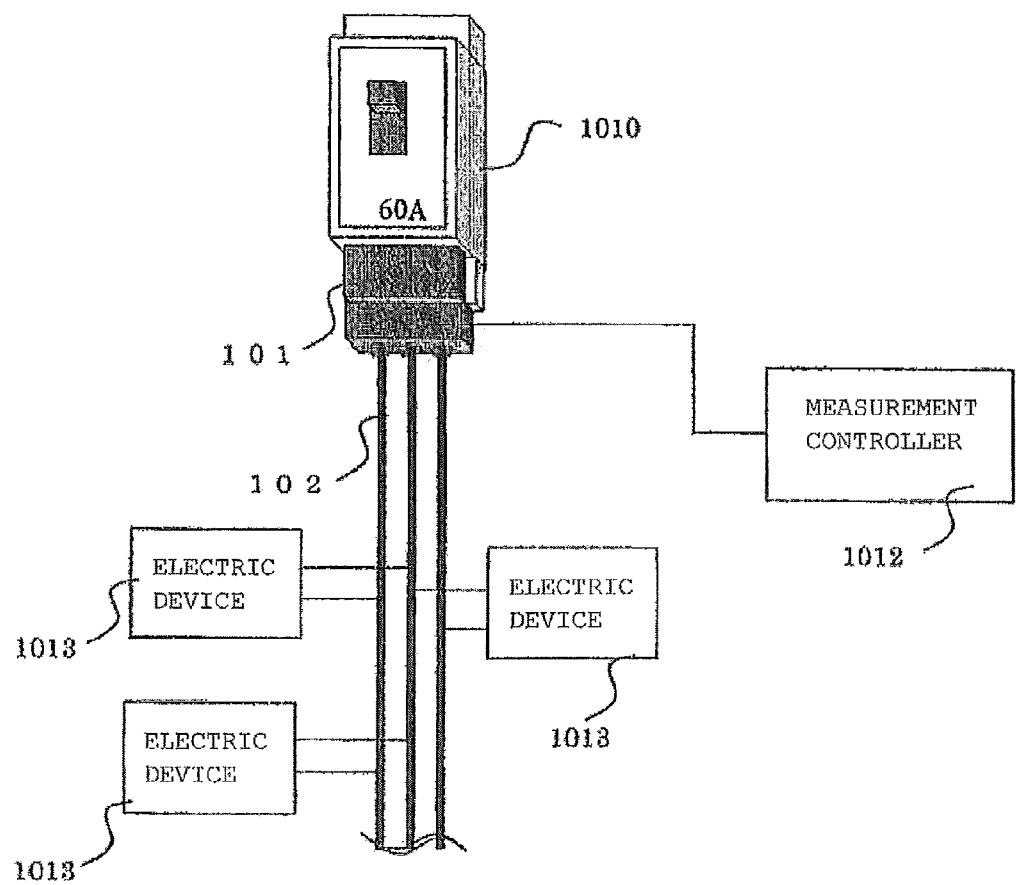
FIG. 17 illustrates an exemplary configuration of a measuring system including the power measuring apparatus according to each of EXAMPLES 10, 11 and 12 of the present invention.

As illustrated in FIG. 17, the power measuring apparatus 101 having the above-described construction is arranged at the terminal portion of the current limiter 1010 and measures power consumed by electric devices 1013 connected to an L1-N phase and an L2-N phase of the electric path 102. Each measured value is transmitted, via the communication control portion 1014 and the communication I/F portion 1015, to a measurement controller 1012 illustrated in FIG. 17, which also has similar I/F means to the communication I/F means for connection to the power measuring apparatus 101 and which performs power measurement. When the power measuring apparatus 101 is mounted to the current limiter 1010, the power measuring apparatus 101 is connected to the L1-N phase and the L2-N phase of the electric path 102 through the electric path contacts 103, and respective AC voltages in the commercial frequency are input to the power supply circuit 105. In the power supply circuit 105, the input AC voltages are each reduced to a predetermined level by the resistance 1041 in FIG. 10, half-wave rectified by the diode 1042, and is smoothed by the smoothing capacitor 1043 for conversion to a DC voltage including a predetermined ripple. The converted DC voltage is then input to the voltage regulator 1044. The voltage regulator 1044 supplies various source powers to the voltage detecting portion 104, the measurement control portion 108, and the wireless communication means 109 for operating them. After automatic resetting upon the supply of the source power, the measurement control portion 108 starts the power measurement. The start of the power measurement may be instructed by a command received from the measurement controller 1012 via the communication I/F portion 1015 and the communication control portion 1014.

The operation of the power measurement will be described below. Respective voltages V1(t) and V2(t) in the L1-N phase and the L2-N phase of the electric path 102 are input to the measurement control portion 108 from the voltage detecting portion 104 after their amplitude values have been converted so as to fall within an input voltage range allowable for the relevant device, e.g., an amplitude range of 5 V or below when the source voltage is 5 V, for example. At the same time, the current transformers 106 each formed in the closed magnetic path measure respective currents flowing through L1 and L2. The current detecting portion 107 adjusts the bias current ib such that an output level from each of the current transformers 106 falls within the linear range of the B-H curve illustrated in FIG. 12. For the L1 and L2 phases, voltage levels Vi1(t) and Vi2(t) obtained from the respective line currents IL and bias current values ib1(t) and ib2(t) are input to the measurement control portion 108. The measurement control portion 108 reads the thus-input V1(t) and V2(t), Vi1(t) and Vi2(t) proportional to the respective line currents, as well as ib1(t) and ib2(t) at predetermined time intervals through AD converters, for example.

The current value I1(t) in the L1 phase is given by subtracting ib1(t), which corresponds to the bias component, from Vi1(t), namely;

$$I1(t)=A Vi1(t)-ib1(t)$$

where A is a constant for converting the voltage value obtained from the line current IL to a current.

Similarly, the current value I2(t) in the L2 phase is given by;

$$I2(t)=A Vi2(t)-ib2(t)$$

where A is a constant for converting the voltage value obtained from the line current IL to a current.

Respective powers in the L1 phase and the L2 phase are calculated based on the following formulae from the current values I1(t) and I2(t) and the voltage values V1(t) and V2(t).

$$P1 = \frac{1}{T}\int V1(t) \times I1(t)dt \qquad \text{[Formulae 2]}$$
$$P2 = \frac{1}{T}\int V2(t) \times I2(t)dt$$

Thus-calculated power values P1 and P2 are transmitted to the measurement controller 1012 via the communication control portion 1014 and the communication I/F portion 1015. Hence the measurement controller 1012 can measure the power values.

As described above, since the measured data is transmitted to the measurement controller via the communication I/F portion 1015 which is isolated in a noncontact manner, the power measuring apparatus 101 can be easily installed free from false wiring. Further, since the communication I/F portion 1015 is also of the noncontact isolated structure, installation work can be safely performed free from electric shock, etc. In addition, since the power supply circuit 105 and the electric path are connected to each other in a non-isolated manner without using any isolation device, the power measuring apparatus 101 can be easily installed at a lower cost and the circuit scale can be reduced.

While in this EXAMPLE the power values are calculated in the measurement control portion, the measurement control portion may be constituted so as to calculate respective integral values of P1 and P2 such that the power measuring apparatus is modified to function as an electric energy meter. As an alternative, the power measuring apparatus 101 may be modified such that a calculation algorithm can be changed from the measurement controller 1012 and a command for changing the calculation algorithm is input to the measurement control portion 108 via the communication control portion 1014 and the communication I/F portion 1015. With such a modification, the measurement control portion 108 can output various measured values by performing separate measurements of the voltage value and the current value, measurements of effective power and ineffective power, etc. with the same configuration.

While the current transformer 106 formed in the closed magnetic path is used in EXAMPLE 10, the same operation and the same advantages can also be obtained by using a current transformer formed in an open magnetic path.

EXAMPLE 11

The operation of a power measuring apparatus according to EXAMPLE 11 of the present invention is described. The construction of the power measuring apparatus according to EXAMPLE 11 is similar to that in EXAMPLE 9 and EXAMPLE 10, and hence a description thereof is omitted. The voltage detecting portion 104 in this EXAMPLE 11 is constituted to be able to detect, in addition to the commercial frequency, higher harmonic components generated from the relevant device. Similarly, the current transformer 106 and the current detecting portion 107 are also constituted to be able to detect, in addition to the commercial frequency, the higher harmonic components generated from the device.

For the power measuring apparatus 101 thus constructed, after confirming that there are no abnormalities in the operation of each electric device and the electric path 102, a user or a person engaged in installing work transmits information indicating a normal state to the power measuring apparatus 101 from, e.g., the measurement controller 1012. The power measuring apparatus 101 observes respective higher harmonic signals in the L1-N and L2-N phases of the electric path 102 for a predetermined period, e.g., 2 to 3 days, and records feature values of higher harmonic patterns, as higher harmonic information in the normal state, in the measurement control portion 108. Thereafter, the power measuring apparatus 101 observes, in addition to the ordinary operation for the power measurement, respective higher harmonic signals in the L1-N and L2-N phases and compares the observed higher harmonic signals with the stored feature values. If the higher harmonic signals differing from the stored feature values are detected, the detected information is notified to the measurement controller 1012 via the wireless communication means 109 or via the communication control portion 1014 and the communication I/F portion 1015. The measurement controller 1012 outputs an alarm indicating degradation of the device to the user as the occasion requires. Thus, the electric device can be safely used by notifying time-dependent deterioration of the relevant device.

EXAMPLE 12

The operation of a power measuring apparatus according to EXAMPLE 12 of the present invention is described. The configuration of the power measuring apparatus according to EXAMPLE 12 is similar to that in EXAMPLE 9 and EXAMPLE 10, and hence a description thereof is omitted. The voltage detecting portion 104 in this EXAMPLE 12 is constituted to be able to detect, in addition to the commercial frequency, higher harmonic components generated from the relevant device. Similarly, the current transformer 106 and the current detecting portion 107 are also constituted to be able to detect, in addition to the commercial frequency, the higher harmonic components generated from the device.

In the power measuring apparatus 101 thus constructed, respective higher harmonic signals in the L1-N and L2-N phases are observed in addition to the ordinary operation for the power measurement. If the higher harmonic signals are detected which have feature values in match with those stored in the measurement control portion 108 and representing electrical discharge generated in the receptacle, such as corona discharge from the electric path, electrical discharge generated due to deterioration of connecting portions in the device, etc., the detected information is notified to the measurement controller 1012 via the wireless communication means 109 or via the communication control portion 1014 and the communication I/F portion 1015. The measurement controller 1012 outputs an alarm indicating degradation of the electric path to the user as the occasion requires. Thus, by notifying time-dependent deterioration of any of the electric path and the connecting portions of the device, the user can take an action, e.g., repair, to cope with the time-dependent deterioration and can safely use the electric device. While, in the above-described example, the presence of an abnormality is determined by storing the feature values in the measurement control portion 108, similar operation and function can be realized and similar advantages can be obtained as well by transmitting the measured higher harmonic signals to the measurement controller 1012, storing the feature values in the measurement controller 1012, and determining the presence of an abnormality from comparison between them. Further, similar advantages can also be obtained by storing the feature values in the measurement controller 1012, and causing the power measuring apparatus 101 to read the stored feature values from the measurement controller 1012 into the measurement control portion 108 via the communication means 109 and then to process the feature values in the measurement portion 108.

Industrial Applicability

Application examples of the noncontact-type power measuring system and the device control system according to the present invention include not only a demand controller and a peak cut controller in a domestic electric device, but also an equipment management system in small-to-medium sized buildings and shops.

Also, application examples of the power measuring apparatus according to the present invention include not only a demand control system and an energy management system in a domestic electric device, but also an energy management and energy saving control system for equipment systems in buildings and factories.

Be it noted that the word "means" used in the above description can be replaced with "portion", "device", or "circuit".

Reference Numerals

1 power line, 2 voltage sensor, 3 current sensor, 4 measuring apparatus, 5 control portion, 6 communication means, 7 integrating portion, 8 load terminal, 9 connector, 10 measuring portion, 11 contact means, 12 voltage measuring terminal, 13 load, 14 communication means, 15 controller, 16 control portion, 17 display console portion, 18 communication means, 19 electric device, 20 device main unit, 21 communication means, 101 power measuring apparatus, 102 electric path, 103 electric path contact, 104 voltage detecting portion, 105 power supply circuit, 106 current transformer, 107 current detecting portion, 108 measurement control portion, 109 wireless communication means, 1010 current limiter, 1012 measurement controller, 1013 electric device, 1014 communication control portion, 1015 communication interface portion, 1016 clamp, 1017 magnetic material, 1041 resistance, 1042 diode, 1043 capacitor, 1044 voltage regulator, and 1045 capacitor.

The invention claimed is:
1. A power measuring system comprising:
a voltage sensor for detecting a voltage waveform of a power line in a noncontact manner through electrostatic coupling;

a current sensor for detecting a current waveform of said power line in a noncontact manner through electromagnetic inductive coupling;

a measuring apparatus including first communication means and a control portion which is connected to said voltage sensor and said current sensor; and a load terminal connected to said power line and including a load of a predetermined value, second communication means for communicating with said first communication means, and a measuring portion for measuring an effective value of a current flowing through said load and calculating an effective value of a voltage based on the measured effective value of the current, wherein the measuring portion of said load terminal transmits the effective value of said current and the effective value of said voltage to said measuring apparatus via said second communication means, the control portion of said measuring apparatus calculates a power value based on the effective value of said current and the effective value of said voltage, which have been received from said load terminal via said first communication means, as well as on the voltage waveform acquired from said voltage sensor and the current waveform acquired from said current sensor, said measuring apparatus includes storage means, upon receiving the effective value of said current and the effective value of said voltage from said load terminal in an initial stage of installation, the control portion of said measuring apparatus calculates a first power value based on the effective value of said current and the effective value of said voltage, calculates a second power value based on the current waveform acquired from said current sensor and the voltage waveform acquired from said voltage sensor, calculates a correction coefficient based on said first power value and said second power value, and stores the calculated correction coefficient in said storage means, and during power measurement, the control portion of said measuring apparatus calculates a power value consumed regarding said power line based on the current waveform acquired from said current sensor, the voltage waveform acquired from said voltage sensor, and the correction coefficient stored in said storage means.

2. A power measuring system comprising:

a voltage sensor for detecting a voltage waveform of a power line in a noncontact manner through electrostatic coupling;

a current sensor for detecting a current waveform of said power line in a noncontact manner through electromagnetic inductive coupling;

a measuring apparatus including first communication means and a control portion which is connected to said voltage sensor and said current sensor; and a load terminal connected to said power line and including a load of a predetermined value, second communication means for communicating with said first communication means, and a measuring portion for measuring an effective value of a current flowing through said load and an effective value of a voltage of said power line, wherein the measuring portion of said load terminal transmits the effective value of said current and the effective value of said voltage to said measuring apparatus via said second communication means, and the control portion of said measuring apparatus calculates a power value based on the effective value of said current and the effective value of said voltage, which have been received from said load terminal via said first communication means, as well as on the voltage waveform acquired from said voltage sensor and the current waveform acquired from said current sensor, said measuring apparatus includes storage means, upon receiving the effective value of said current and the effective value of said voltage from said load terminal in an initial stage of installation, the control portion of said measuring apparatus calculates a first power value based on the effective value of said current and the effective value of said voltage, calculates a second power value based on the current waveform acquired from said current sensor and the voltage waveform acquired from said voltage sensor, calculates a correction coefficient based on said first power value and said second power value, and stores the calculated correction coefficient in said storage means, and during power measurement, the control portion of said measuring apparatus calculates power value consumed regarding said power line based on the current waveform acquired from said current sensor, the voltage waveform acquired from said voltage sensor, and the correction coefficient stored in said storage means.

3. The power measuring system of claim 1, wherein the measuring apparatus includes an integrating portion for integrating said calculated lower value regarding said power line for a predetermined period.

4. The power measuring system of claim 1, wherein the measuring apparatus includes an integrating portion for integrating said calculated lower value regarding said power line for a predetermined period.

5. The power measuring system of claim 1, wherein said terminal comprises a current detector for detecting a current in an electric path to which an electric device is connected;

an electric path contact for detecting a voltage of said electric path;

a computing portion for calculating power consumed by said electric device based on an output from said current detector and an output from said electric path contact; and a power supply portion for receiving power from said electric path through said electric path contact and supplying power to said computing portion, wherein said power supply portion is constituted by a circuit that is not isolated from said electric path.

6. The power measuring system of claim 5, wherein said terminal includes a communicating portion for performing noncontact communication, including wireless communication with an external measurement controller.

7. The power measuring system of claim 5, wherein said current detector is constituted by at least one of a current transformer formed in an open magnetic path and a current transformer formed in a closed magnetic path.

8. The power measuring system of claim 7, wherein said current transformer includes a load current detection coil and a bias applying coil.

9. The power measuring system of claim 6, wherein said terminal comprises a current measuring portion for converting the output from said current detector to a signal adapted for being input to said computing portion, and a voltage measuring portion for converting the output from said electric path contact to a signal adapted for being input to said computing portion, said voltage measuring portion includes first higher harmonics detection means for detecting higher harmonic components not lower than utility frequency, said current measuring portion includes second higher harmonics detection means for detecting said higher harmonic components, and said computing portion holds a feature value of a high harmonic pattern of a high harmonic signal generated upon said electric path directly causing electrical discharge, compares a component detected by at least one of said first higher harmonics detection means and said second higher harmonics detection means with said feature value, and if a predetermined requirement is satisfied, transmits an alarm signal indicating deterioration of the electric path to said measurement controller via said communicating portion, thus urging a warning output to be issued.

10. The power measuring system of claim 6, wherein, said terminal comprises a current measuring portion for converting the output from said current detector to a signal adapted for being input to said computing portion, and voltage measuring portion for converting the output from said electric path contact to a signal adapted for being input to said computing portion, said voltage measuring portion includes first higher harmonics detection means for detecting higher harmonic components not lower than utility frequency, said current measuring portion includes second higher harmonics detection means for detecting said higher harmonic components, and said computing portion holds a feature value of a high harmonic pattern of a high harmonic signal generated when the device is in a normal state, compares a component detected by at least one of said first higher harmonics detection means and said second higher harmonics detection means with said feature value, and if a predetermined requirement is satisfied, transmits an alarm signal indicating deterioration of the electric device to said measurement controller via said communicating portion.

11. The power measuring system of claim 9, wherein the feature value is set in said computing portion in advance.

12. The power measuring system of claim 9, wherein the feature value is read into said computing portion from said measurement controller via said communicating portion.

13. The power measuring system of claim 5, further comprising an electric breaker including a terminal block for said electric path and a switch for selectively controlling connection to and cutoff from said electric path, wherein said load terminal is mounted to said electric breaker by fitting said electric path contact to said terminal block.

14. The power measuring system of claim 6, wherein the communicating portion of said terminal device comprises a first coil for transferring power and a data signal in an electromagnetic inductive wireless manner, a power converting portion for converting the power supplied through said first coil, and a communication control portion for controlling data communication to and from said measurement controller through said first coil, and the communication means of said measurement controller comprises a second coil for transferring power and a data signal in an electromagnetic inductive wireless manner, a power receiving portion for receiving the power supplied from said measuring apparatus through said second coil, a communication control portion for controlling data communication to and from said measuring apparatus through said second coil, and a communication I/F portion.

15. The power measuring system of claim 9, wherein said measurement controller has warning output means, and said measurement controller causes said warning output means to output a warning upon receiving the alarm signal.

16. An electric device control system comprising:

the power measuring system of claim 1;

at least one electric device including a main unit and third communication means; and a controller including fourth communication means for communicating with said first communication means and said third communication means, an electric device control portion for controlling said electric device, and a display and console portion, wherein said controller controls said electric device based on a measured power value or an measured and integrated electric energy value, which is obtained from said measuring apparatus.

17. A power measuring system comprising:

a voltage sensor for detecting a voltage waveform of a power line in a noncontact manner through electrostatic coupling;

a current sensor for detecting a current waveform of said power line in a noncontact manner through electromagnetic inductive coupling;

a measuring apparatus including first communication means and a control portion which is connected to said voltage sensor and said current sensor; and a load terminal connected to said power line and including a load of a predetermined value, second communication means for communicating with said first communication means, and a measuring portion for measuring an effective value of a current flowing through said load and calculating an effective value of a voltage based on the measured effective value of the current, wherein the measuring portion of said load terminal transmits the effective value of said current and the effective value of said voltage to said measuring apparatus via said second communication means, the control portion of said measuring apparatus calculates a power value based on the effective value of said current and the effective value of said voltage, which have been received from said load terminal via said first communication means, as well as on the voltage waveform acquired from said voltage sensor and the current waveform acquired from said current sensor, said load terminal is connected to said power line and includes the load of the predetermined value and contact means for opening and closing a line wired between said power line and said load, the control portion of said measuring apparatus transmits a first command to said load terminal via said first communication means in an initial stage of installation and, upon receiving the first command from said measuring apparatus via said second communication means, the measuring portion of said load terminal closes said contact means and acquires the effective value of the current flowing through said load and the effective value of the voltage of said power line, at the same time, the control portion of said measuring apparatus acquires a first current waveform from said current sensor and a first voltage waveform from said voltage sensor, thereafter the control portion of said measuring apparatus transmits a second command to said load terminal via said first communication means and, upon receiving the second command from said measuring apparatus via said second communication means, the measuring portion of said load terminal opens said contact means, at the same time, the control portion of said measuring apparatus acquires a second current waveform from said current sensor and a second voltage waveform from said voltage sensor, thereafter the control portion of said measuring apparatus transmits a third command to said load terminal via said first communication means and, upon receiving the third command from said measuring apparatus via said second communication means, the measuring portion of said load terminal transmits the effective value of said current and the effective value of said voltage to said measuring apparatus via said second communication means, and the control portion of said measuring apparatus calculates a first power value based on said first current waveform and said first voltage waveform, calculates a second power value based on said second current waveform and said second voltage waveform, calculates a third power value from a difference between said first power value and said second power value, calculates a fourth power value based on the effective value of said current and the effective value of said voltage which have been received from said load terminal via said first communication means, calculates a correction coefficient based on said third power value and said fourth power value.

18. A power measuring system comprising:

a voltage sensor for detecting a voltage waveform of a power line in a noncontact manner through electrostatic coupling;

a current sensor for detecting a current waveform of said power line in a noncontact manner through electromagnetic inductive coupling;

a measuring apparatus including first communication means and a control portion which is connected to said voltage sensor and said current sensor; and a load terminal connected to said power line and including a load of a predetermined value, second communication means for communicating with said first communication means, and a measuring portion for measuring an effective value of a current flowing through said load and an effective value of a voltage of said power line, wherein the measuring portion of said load terminal transmits the effective value of said current and the effective value of said voltage to said measuring apparatus via said second communication means, and the control portion of said measuring apparatus calculates a power value based on the effective value of said current and the effective value of said voltage, which have been received from said load terminal via said first communication means, as well as on the voltage waveform acquired from said voltage sensor and the current waveform acquired from said current sensor, said load terminal is connected to said power line and includes the load of the predetermined value and contact means for opening and closing a line wired between said power line and said load, the control portion of said measuring apparatus transmits a first command to said load terminal via said first communication means in an initial stage of installation and, upon receiving the first command from said measuring apparatus via said second communication means, the measuring portion of said load terminal closes said contact means and acquires the effective value of the current flowing through said load and the effective value of the voltage of said power line, at the same time, the control portion of said measuring apparatus acquires a first current waveform from said current sensor and a first voltage waveform from said voltage sensor, thereafter the control portion of said measuring apparatus transmits a second command to said load terminal via said first communication means and, upon receiving the second command from said measuring apparatus via said second communication means, the measuring portion of said load terminal opens said contact means, at the same time, the control portion of said measuring apparatus acquires a second current waveform from said current sensor and a second voltage waveform from said voltage sensor, thereafter the control portion of said measuring apparatus transmits a third command to said load terminal via said first communication means and, upon receiving the third command from said measuring apparatus via said second communication means, the measuring portion of said load terminal transmits the effective value of said current and the effective value of said voltage to said measuring apparatus via said second communication means, and the control portion of said measuring apparatus calculates a first power value based on said first current waveform and said first voltage waveform, calculates a second power value based on said second current waveform and said second voltage waveform, calculates a third power value from a difference between said first power value and said second power value, calculates a fourth power value based on the effective value of said current and the effective value of said voltage which have been received from said load terminal via said first communication means, calculates a correction coefficient based on said third power value and said fourth power value.

19. An electric device control system comprising the power measuring system of claim 2;

at least one electric device including a main unit and third communication means, and a controller including fourth communication means for communicating with said first communication means and said third communication means, an electric device control portion for controlling said electric device, and a display and console portion, wherein said controller controls said electric device-based on a measured power value or an measured and integrated electric energy value, which is obtained from said measuring apparatus.

20. An electric device control system comprising the power measuring system of claim 17;

at least one electric device including a main unit and third communication means, and a controller including fourth communication means for communicating with said first communication means and said third communication means, an electric device control portion for controlling said electric device, and a display and console portion, wherein said controller controls said electric device-based on a measured power value or an measured and integrated electric energy value, which is obtained from said measuring apparatus.

21. An electric device control system comprising the power measuring system of claim 18;

at least one electric device including a main unit and third communication means, and a controller including fourth communication means for communicating with said first communication means and said third communication means, an electric device control portion for controlling said electric device, and a display and console portion,
wherein said controller controls said electric device-based on a measured power value or an measured and integrated electric energy value, which is obtained from said measuring apparatus.

* * * * *